（12）United States Patent
Galor Gluskin

(10) Patent No.: US 10,638,055 B2
(45) Date of Patent: Apr. 28, 2020

(54) APERTURE SIMULATION

(71) Applicant: QUALCOMM Incorporated, San Diego, CA (US)

(72) Inventor: Micha Galor Gluskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 15/871,598

(22) Filed: Jan. 15, 2018

(65) Prior Publication Data

US 2019/0222738 A1    Jul. 18, 2019

(51) Int. Cl.
H04N 5/235 (2006.01)
H04N 5/355 (2011.01)
H01L 27/146 (2006.01)
H04N 13/00 (2018.01)

(52) U.S. Cl.
CPC ..... *H04N 5/2355* (2013.01); *H01L 27/14603* (2013.01); *H01L 27/14609* (2013.01); *H01L 27/14621* (2013.01); *H01L 27/14623* (2013.01); *H01L 27/14627* (2013.01); *G06T 2200/21* (2013.01); *H04N 5/35563* (2013.01); *H04N 2013/0088* (2013.01)

(58) Field of Classification Search
CPC ......... H04N 5/2355; H04N 2013/0088; H04N 5/35563; H01L 27/14623; H01L 27/14609; G06T 2200/21
See application file for complete search history.

(56) References Cited

U.S. PATENT DOCUMENTS

| | | | |
|---|---|---|---|
| 7,088,395 B2 * | 8/2006 | Takayama | H04N 5/2351 348/297 |
| 7,636,115 B2 | 12/2009 | Hong et al. | |
| 8,698,064 B2 | 4/2014 | Otake et al. | |
| 9,066,034 B2 | 6/2015 | Yahata | |
| 9,210,391 B1 * | 12/2015 | Mills | H04N 9/07 |
| 2002/0186309 A1 * | 12/2002 | Keshet | G06T 3/4015 348/272 |
| 2004/0032523 A1 * | 2/2004 | Hartlove | H01L 27/14625 348/340 |
| 2005/0036041 A1 * | 2/2005 | Gallagher | H04N 3/155 348/222.1 |
| 2005/0133879 A1 | 6/2005 | Yamaguti et al. | |
| 2006/0291056 A1 | 12/2006 | Murata et al. | |
| 2007/0177004 A1 * | 8/2007 | Kolehmainen | H04N 5/2254 348/42 |
| 2007/0242875 A1 * | 10/2007 | Tanaka | G06K 9/40 382/162 |

(Continued)

*Primary Examiner* — Ming Y Hon
(74) *Attorney, Agent, or Firm* — Duane Morris LLP

(57) ABSTRACT

Image processing can include receiving an aperture level and producing a full-color image. The full-color image can be produced by assigning a greater weight to first sensor pixels and assigning a lesser weight to second sensor pixels based on the received aperture level. The greater weight can exceed the lesser weight. An image sensor panel can include the first sensor pixels and the second sensor pixels. Each of the first sensor pixels can have a first color-filter-independent-photosensitivity (CFIP) and each of the second sensor pixels having a second CFIP. The first CFIP can be larger or smaller than the second CFIP.

25 Claims, 23 Drawing Sheets

(56) References Cited

U.S. PATENT DOCUMENTS

| | | | | |
|---|---|---|---|---|
| 2010/0128137 A1* | 5/2010 | Guidash | ................ | H04N 5/232 348/222.1 |
| 2011/0118031 A1* | 5/2011 | Mao | ................ | G06F 3/017 463/37 |
| 2013/0300836 A1* | 11/2013 | Zhao | ................ | A61B 1/00193 348/46 |
| 2014/0125810 A1* | 5/2014 | D'Amico | ................ | H04N 5/2258 348/164 |
| 2014/0247979 A1* | 9/2014 | Roffet | ................ | H04N 5/235 382/163 |
| 2015/0049215 A1* | 2/2015 | Kuang | ................ | H04N 5/35581 348/231.6 |
| 2015/0163406 A1* | 6/2015 | Laroia | ................ | G02B 27/58 348/208.1 |
| 2015/0319326 A1* | 11/2015 | Pfeiffer | ................ | G01B 11/2513 358/474 |
| 2016/0284314 A1* | 9/2016 | Darshan | ................ | G09G 5/028 |

* cited by examiner

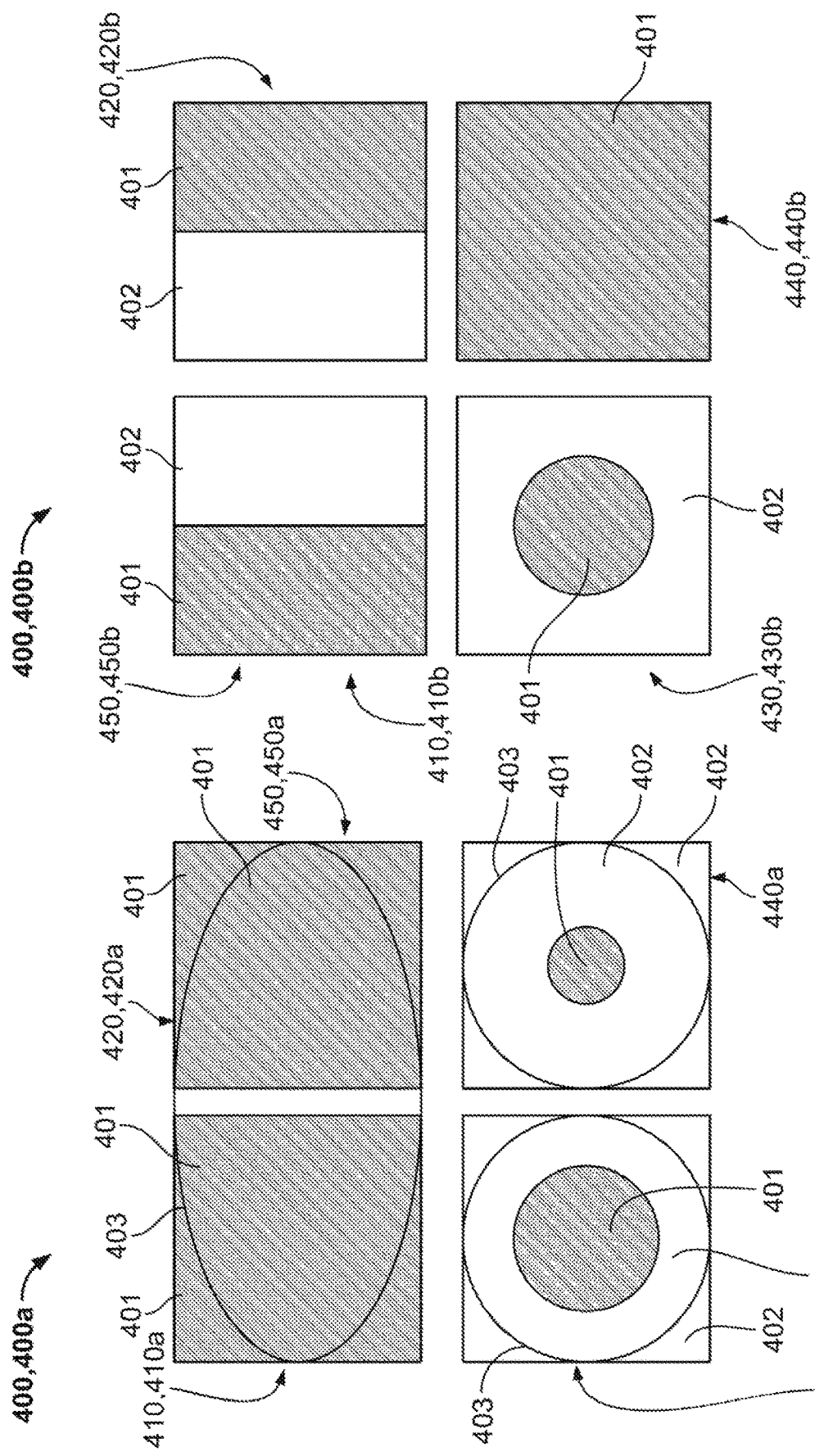

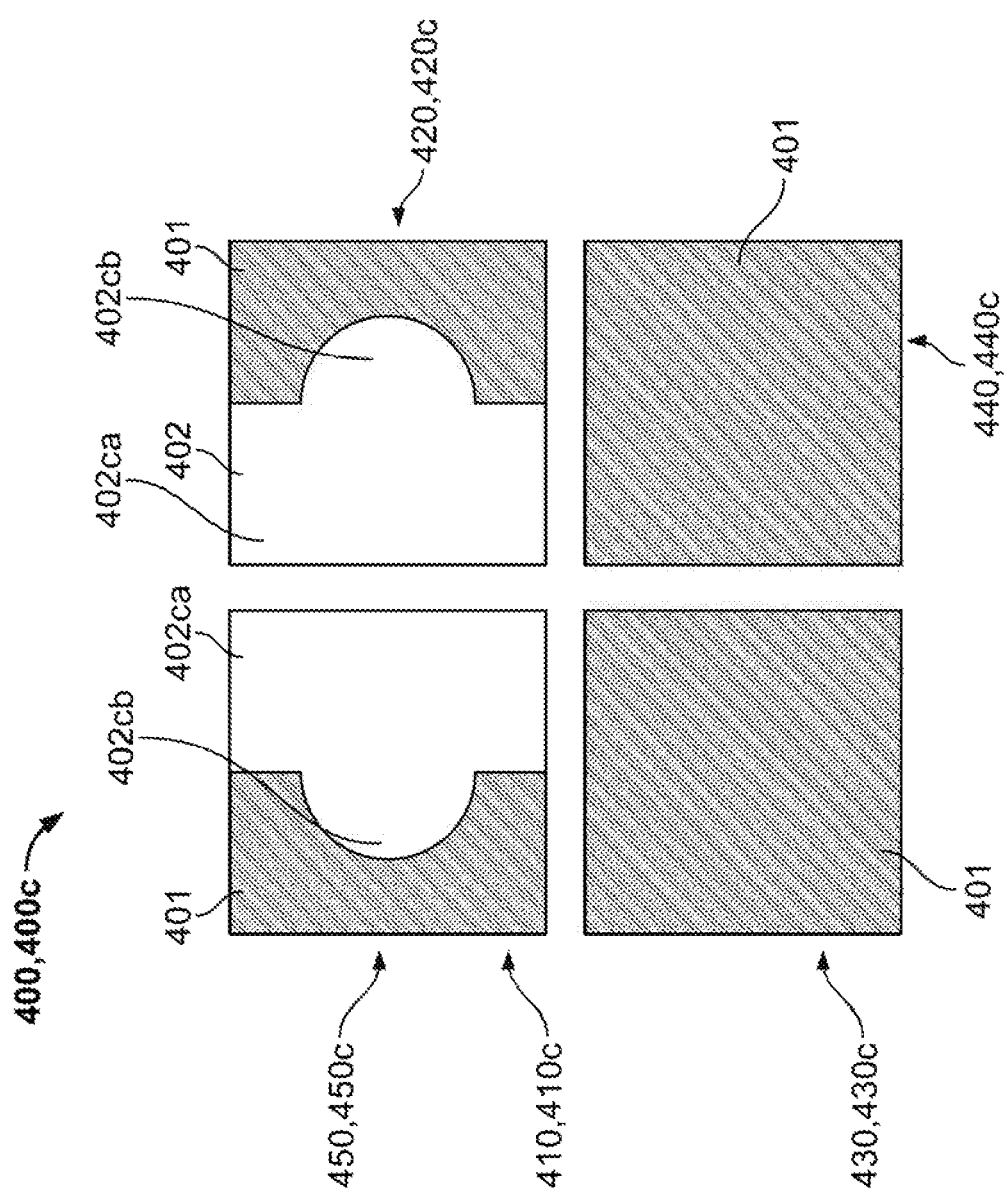

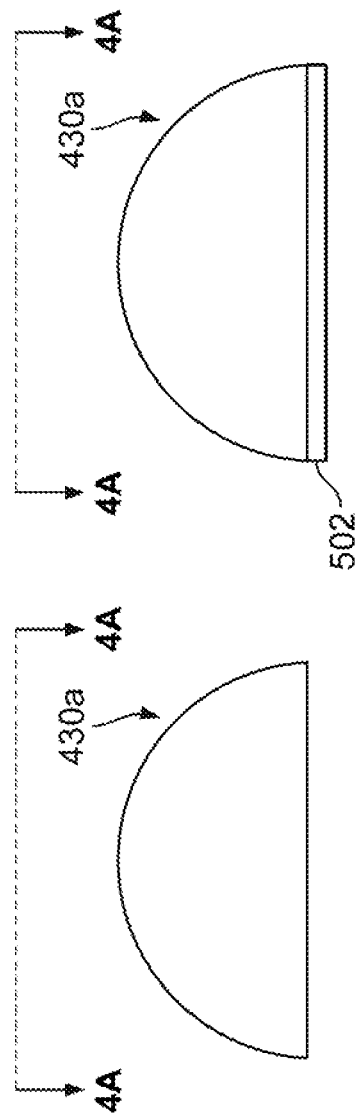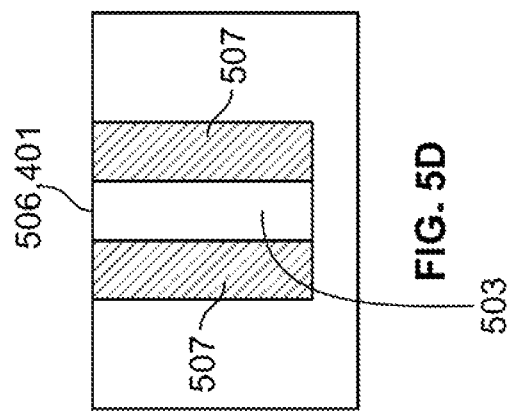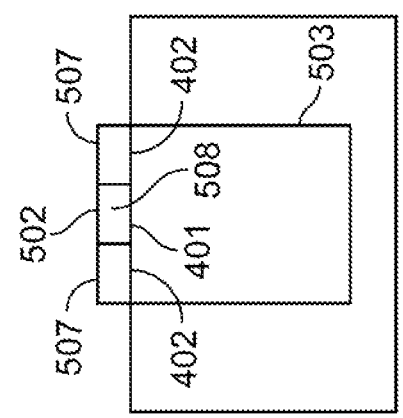

| Sensor Panel Configuration | Camera Pixel | | | |
|---|---|---|---|---|
| | 410 | 420 | 430 | 440 |
| 121a (Fig. 4A) | T1 | Same as 410 | T2 | T3 |
| 121b (Fig. 4B) | T1 or T3 | Same as 410 | T2 or T4 | T1 |
| 121c (Fig. 4C) | T1 or T2 | Same as 410 | T1 | T1 |
| 121d (Fig. 4D) | T1 | Same as 410 | T2 | Same as 410 |
| 121e (Fig. 4E) | T1 | T2 | T3 | T4 |

FIG. 10A

| Sensor Panel Configuration | User-Selected Aperture Level | | | | |
|---|---|---|---|---|---|
| | Maximum | High | Medium | Low | Minimum |
| 121a (Fig. 4A) | (911 + 912)/2 | Blend Max and Medium | 913 | Blend Medium and Min | 914 |
| 121b (Fig. 4B) | 913 OR ((911 + 912)/2 + 913)/2 | Blend Max and Min | Blend Max and Min | Blend Max and Min | 913 |
| 121c (Fig. 4C) | 913 OR 914 OR (913 + 914)/2 | Blend Max and Min | Blend Max and Min | Blend Max and Min | Max-911-912 |
| 121d (Fig. 4D) | 911 OR 912 OR 914 OR (911 + 912 + 914)/3 | Blend Max and Min | Blend Max and Min | Blend Max and Min | 913 |
| 121e (Fig. 4E) | 911 | 912 | Blend High and Low | 913 | 914 |

FIG. 10B

| Sensor Panel Configuration | Maximum Aperture Level | Second Mosaics | | | |
|---|---|---|---|---|---|
| | | High Aperture Level | Medium Aperture Level | Low Aperture Level | Minimum Aperture Level |
| 121a (Fig. 4A) | (911 + 912)/2 | | 913 | | 914 |
| 121b (Fig. 4B) | 913 or ((911 + 912)/2 + 913)/2 | | | | 913 |
| 121c (Fig. 4C) | 913 or 914 or (913 + 914)/2 | | | | Max - 911 - 912 |
| 121d (Fig. 4D) | 911 or 912 or 914 or (911 + 912 + 914)/3 | | | | 913 |
| 121e (Fig. 4E) | 911 | 912 | | 913 | 914 |

FIG. 16

|  |  | User-selected Aperture Level ||||| 
| --- | --- | --- | --- | --- | --- | --- |
|  |  | Maximum | High | Medium | Low | Minimum |
| Sensor Panel Configuration | 121a (Fig. 4A) | Max AL | Blend Max AL and Medium AL | Medium AL | Blend Medium AL and Min AL | Min AL |
|  | 121b (Fig. 4B) | Max AL | Blend Max AL and Min AL | Blend Max AL and Min AL | Blend Max AL and Min AL | Min AL |
|  | 121c (Fig. 4C) | Max AL | Blend Max AL and Min AL | Blend Max AL and Min AL | Blend Max AL and Min AL | Min AL |
|  | 121d (Fig. 4D) | Max AL | Blend Max AL and Min AL | Blend Max AL and Min AL | Blend Max AL and Min AL | Min AL |
|  | 121e (Fig. 4E) | Max AL | High AL | Blend High AL and Low AL | Low AL | Min AL |

FIG. 17

APERTURE SIMULATION

BACKGROUND

Field of the Disclosure

The present disclosure relates to digital imaging.

Description of Related Art

Digital cameras often include a lens, an aperture, and an image sensor panel with millions of sensor pixels. Light flows through the lens and the aperture until reaching the image sensor panel. Each sensor pixel can include one or more photodiodes. The photodiodes capture analog photometrics of the incoming light. One or more processors (e.g., circuitry) prepare an image based on the captured metrics.

Aperture size dictates depth-of-field. Field (also called field of focus) is a three-dimensional scene area that appears in-focus on the image sensor panel. Scene area before and after the field will be out-of-focus on the image sensor panel. An image produced with a large aperture is a high-aperture level image and will have a shallow depth of field. An image produced with a small aperture is a low-aperture level image and will have a deep depth of field.

Cameras often include mechanically adjustable apertures (sometimes referred to as traditional apertures), which a user can open and close depending on how the user wants the image to appear (e.g., depth-of-field, saturation, integration time).

SUMMARY

An image processing method can include, via one or more processors: receiving an aperture level and producing a full-color image. The full-color image can be produced by assigning a greater weight to first sensor pixels and assigning a lesser weight to second sensor pixels based on the received aperture level. The greater weight can exceed the lesser weight. An image sensor panel can include the first sensor pixels and the second sensor pixels. Each of the first sensor pixels can have a first color-filter-independent-photosensitivity (CFIP) and each of the second sensor pixels having a second CFIP. The first CFIP can be larger or smaller than the second CFIP.

An image processing method can include, via one or more processors: receiving a first aperture level; producing a first mosaic of an image; remosaicing the first mosaic into a second mosaic of the image based on the received first aperture level; demosaicing the second mosaic of the image into a first full-color image; receiving a second aperture level; remosaicing the first mosaic into a third mosaic of the image based on the received second aperture level; and demosaicing the third mosaic of the image into a second full-color image.

A processing system can include an image sensor panel and one or more processors. The image sensor panel can include first sensor pixels and second sensor pixels. Each of the first sensor pixels can have a first color-filter-independent-photosensitivity (CFIP) and each of the second sensor pixels can have a second CFIP. The first CFIP can be larger or smaller than the second CFIP. The one or more processors can be configured to: receive an aperture level; produce a full-color image by assigning a greater weight to first sensor pixels and assigning a lesser weight to second sensor pixels based on the received aperture level, the greater weight exceeding the lesser weight.

A processing system can include: means for receiving an aperture level; means for producing a full-color image by assigning a greater weight to first sensor pixels and assigning a lesser weight to second sensor pixels based on the received aperture level, the greater weight exceeding the lesser weight. A color-filter-independent-photosensitivity (CFIP) of the first sensor pixels can be different than a CFIP of the second sensor pixels.

A non-transitory computer-readable medium can include program code, which, when executed by one or more processors, causes the one or more processors to perform operations. The program code can include code for: receiving an aperture level and producing a full-color image. The program code can include code for: producing the full-color image by assigning a greater weight to first sensor pixels and assigning a lesser weight to second sensor pixels based on the received aperture level. The greater weight can exceed the lesser weight.

A non-transitory computer-readable medium can include program code, which, when executed by one or more processors, causes the one or more processors to perform operations. The program code can include code for: receiving a first aperture level; producing a first mosaic of an image; remosaicing the first mosaic into a second mosaic of the image based on the received first aperture level; demosaicing the second mosaic of the image into a first full-color image; receiving a second aperture level; remosaicing the first mosaic into a third mosaic of the image based on the received second aperture level; and demosaicing the third mosaic of the image into a second full-color image.

BRIEF DESCRIPTION OF DRAWINGS

The above summary and the below detailed description of illustrative embodiments may be better understood when read in conjunction with the appended Figures. The Figures show some of the illustrative embodiments discussed herein. As further explained below, the claims are not limited to the illustrative embodiments. For clarity and ease of reading, some Figures omit views of certain features. Unless expressly stated otherwise, the Figures are not to scale and features are shown schematically.

FIGS. 4A-4E show example sensor pixel patch configurations. FIGS. 4A-4E are from a plan perspective.

FIGS. 5A-5E show example sensor pixel configurations. FIGS. 5A-5D are from a cross-sectional elevational perspective. FIG. 5E is from a plan perspective.

FIGS. 8A and 8B show example image mosaics.

FIG. 10A is a table of example sensor pixel integration times.

FIG. 10B is a table of example binning operations.

FIG. 16 is a table of original source pixels for example mosaics.

FIG. 17 is a table of example blends between different mosaics.

DETAILED DESCRIPTION

Figure 1:
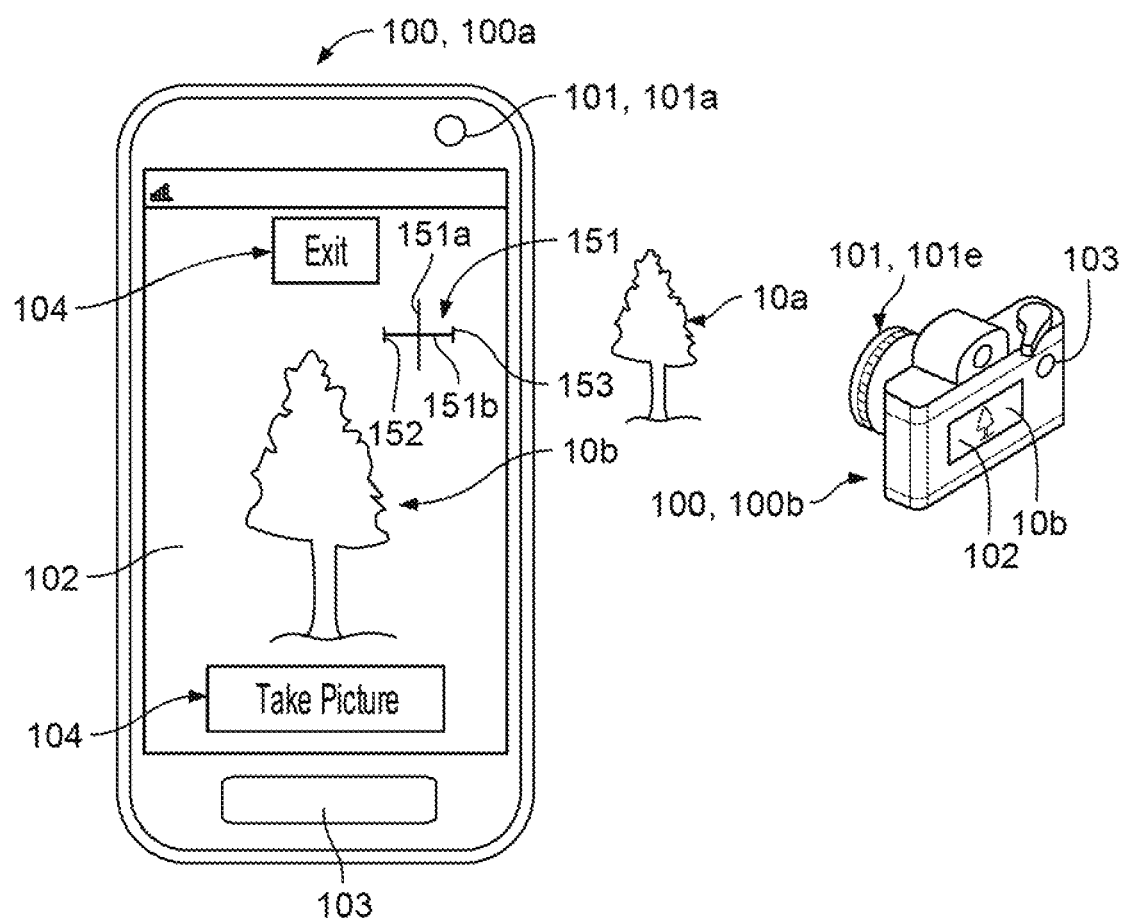
FIG. 1 shows example mobile devices.

The present application includes illustrative embodiments. The claims are not limited to the illustrative embodiments. Therefore, some claimed implementations will have different features than in the illustrative embodiments. Changes can be made without departing from the spirit of the disclosure. For example, features of the illustrative embodiments can be incorporated in different systems (e.g., devices) and methods. The claims are intended to cover implementations with such changes.

At times, the present application uses relative terms (e.g., front, back, top, bottom, left, right, etc.) to give the reader context when viewing the Figures Relative terms do not limit the claims. Any relative term can be replaced with a numbered term (e.g., left can be replaced with first, right can be replaced with second, and so on).

Among other things, the present application enables simulation of a traditional aperture (i.e., a mechanically adjustable aperture). A mobile device can include a sensor panel with sensor pixels. The sensor pixels can have differently sized exposed areas. First sensor pixels with large exposed areas can simulate the perspective from a large aperture. Second sensor pixels with small exposed areas can simulate the perspective from a small aperture.

When a user presses "capture," the mobile device can capture (e.g., image) a scene from the multiple different aperture perspectives. After capture, the mobile device can arrange photometrics captured by the first sensor pixels into a high aperture level image and photometrics captured by the second sensor pixels into a small aperture level image. Therefore, the user can view the scene from a large aperture perspective with shallow depth of field and from a low aperture perspective with a deep depth of field. The high aperture level image and the low aperture level image can be combined. The high aperture level image, the low aperture level image, or the combined image can be streamed to a display of the mobile device (e.g., when the mobile device is in viewfinder mode). The high aperture level image, the low aperture level, or the combined image can serve as a frame of a video.

The present application discloses post-processing technology that enables the user to take advantage of the different perspectives. For example, the user can composite regions of the high aperture level image with regions of the low aperture level image. The user might capture a scene with a tree in the foreground and a river in the background. The tree might look best in the high aperture level image and the river might look best in the low aperture level image. The user can composite the best regions of the high aperture level image (the tree) with the best regions of the low aperture level image (the river).

As discussed, embodiments of the present disclosure can improve a mobile device without a traditional aperture. But embodiments of the present disclosure are also useful for mobile devices having a traditional aperture.

The present application discloses a mobile device with a traditional aperture plus first sensor pixels and second sensor pixels. The user can adjust the traditional aperture to a desired size, then capture images with multiple aperture levels. First sensor pixels can produce a first image with an aperture level equal to the size of the traditional aperture. Second sensor pixels can produce a second image with a smaller aperture level. After capture, the user can view both images. Both images can be captured in parallel (e.g., simultaneously).

Figure 2:
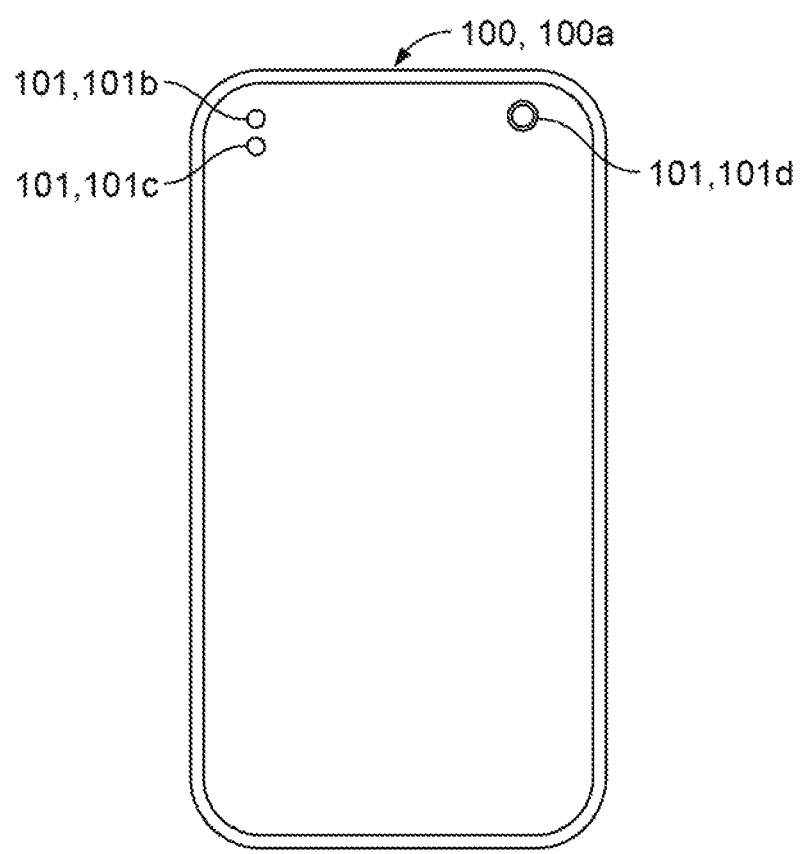
FIG. 2 shows a back of an example mobile device.

FIG. 1 shows mobile devices 100 capturing a scene 10a. Mobile device 100 can be a smartphone 100a or a dedicated camera assembly 100b. FIG. 2 shows a rear of smartphone 100a. Mobile device 100 can include one or more cameras 101 (also called optical sensors, image sensors, and the like).

Smartphone 100a can include cameras 101a-101d. Camera assembly 100b can include camera 101e. Besides cameras 101, mobile device 100 can include a frame (not labeled), a display 102, and hard buttons 103. Mobile device 100 can be configured to present soft or virtual buttons 104 on display 102.

Although dedicated camera assembly 100b is typically referred to as a "camera," the present application does not apply this meaning. As used herein, a "camera" can be any kind of digital image sensor. Therefore, the term "camera" encompasses digital image sensors of dedicated camera assemblies 100b and digital image sensors mounted to any kind of device (e.g., a smartphone 100a, a vehicle, etc.).

Mobile device 100 can be configured to enter a viewfinder mode where images 10b captured by one or more cameras 101 are presented on display 102. When the user presses a hard or soft button 103, 104, mobile device 100 can be configured to store (i.e., preserve) an image in memory. Mobile device 100 can store the image in memory indefinitely.

When in viewfinder mode, mobile device 100 can present an aperture simulation tool 151 on display 102. Tool 151 can enable the user to select from one of a plurality (e.g., two, three, four, five, twenty) of different aperture-levels (also called aperture simulations or simulated apertures). Tool 151 can include a toggle 151a (e.g., a switch or slider) that slides along a line 151b. Tool 151 can show a maximum aperture level 152 and a minimum aperture level 153. Tool 151 can also be called an "aperture priority mode selector".

As the user sets aperture with tool 151, the aperture level (e.g., depth of field) of the images presented during viewfinder mode can change via any of the processes discussed with reference to FIG. 7B. As discussed below, each image presented during viewfinder mode can be prepared according to blocks 700-710 of FIG. 7B.

Figure 3:
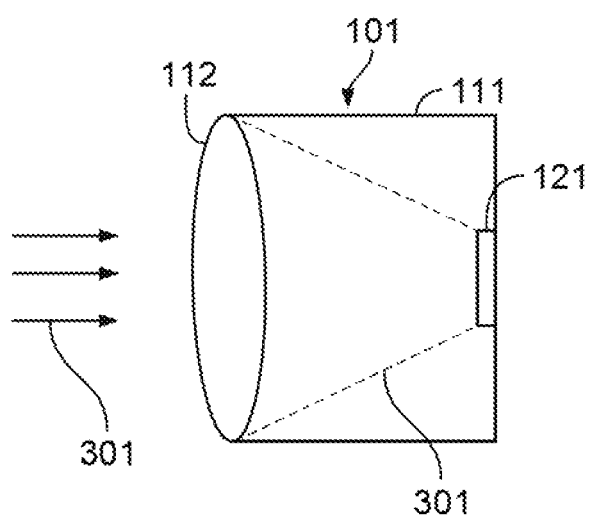
FIG. 3 is a cross-sectional elevational view of an example camera for a mobile device.

FIG. 3 is a schematic view of camera 101, which can be mounted in mobile device 100, or any other kind of system (e.g., a vehicle). Camera 101 can include a housing 111 retaining a lens 112 and a sensor panel 121. As shown in FIG. 3, lens 112 can admit light 301 from a scene (e.g., scene 10a of FIG. 1), and output converged light 301, which contacts sensor panel 121. Although not shown, camera 101 can include a plurality of lenses and other optical-mechanical elements such as traditional apertures, shutters, mirrors, and the like. According to some examples, camera 101 does not include an adjustable traditional aperture.

As explained below with reference to FIG. 18, mobile device 100 can include a processing system 1800 with one or more processors 1801 and memory 1802. According to some examples, camera(s) 101, display 102, and hard buttons 103 (shown in FIG. 1), are components of processing system 1800. Processing system 1800 can be configured to perform some or all of the functions, operations, and methods disclosed herein. Processing system 1800 can be present in any kind of device (e.g., a vehicle can include processing system 1800).

FIGS. 4A-4E show a plan perspective of example sensor pixel clusters 400a-400e (generically referred to as sensor pixel cluster(s) 400). FIGS. 4A-4E show cluster 400 as having green sensor pixels, but as discussed below, clusters 400 can have any color pixels (e.g., green, blue, red, etc.). According to some examples, the exposed areas 401 and masked areas 402 in FIGS. 4A-4E can be to scale. According to other examples, FIGS. 4A-4E are not to scale.

Sensor pixel cluster 400 can include a first sensor pixel 410a-410e (generically referred to as first sensor pixel 410), a second sensor pixel 420a-420e (generically referred to as second sensor pixel 420), a third sensor pixel 430a-430e (generically referred to as third sensor pixel 430), and a fourth sensor pixel 440a-440e (generically referred to as fourth sensor pixel 440). Two or more sensor pixels 410, 420, 430, and 440 can define a phase detection group 450. The two or more sensor pixels in a phase detection group 450 can be arranged horizontally, vertically, diagonally, or some combination thereof with respect to each other. Each sensor pixel 410, 420, 430, and 440 can include one or more photodiodes, a color filter, and at least a portion of a microlens 403.

Sensor pixels 410, 420, 430, and 440 can have an exposed area 401 and a masked area 402 (also called a shielded area). One or more shields (discussed below) can define exposed area 401 and define masked area 402. Each masked area 402 can represent a shield. Each sensor pixel cluster 400 can have at least multiple (e.g., two, three, four) sensor pixels 410, 420, 430, and 440 with different sized exposed areas 401.

Exposed area 401 can be photosensitive. Masked area 402 can be originally manufactured as photosensitive (i.e., originally photosensitive). When shielding is applied directly on a photodiode, masked area 402 can be effectively rendered non-photosensitive. When shielding is applied above, but not directly on a photodiode, masked area 402 can be effectively rendered non-photosensitive or less-photosensitive. Therefore, the amount of shielding on a sensor pixel can define (e.g., at least partially define) the sensor pixel's photosensitivity. Any instance of photosensitivity in the present disclosure can be understood to mean color-filter-independent-photosensitivity (CFIP) unless context dictates otherwise. CFIP is further explained below.

A sensor pixel with no shielding can have a first photosensitivity. A sensor pixel with a small amount of shielding can have a second photosensitivity. A sensor pixel with a medium amount of shielding can have a third photosensitivity. A sensor pixel with a large amount of shielding can have a fourth photosensitivity. The first photosensitivity can exceed the second photosensitivity, which can exceed the third photosensitivity, which can exceed the fourth photosensitivity.

Each sensor pixel 410, 420, 430, and 440 can have the same capacity to store photocharge. Prior to application of shielding, each sensor pixel can have the same amount of color-filter-independent-photosensitivity (CFIP). Color-filter-independent-photosensitivity can relate to the photosensitivity of a sensor pixel independent of the sensor pixel's color filter. Therefore, a sensor pixel with a blue color filter and a small amount of shielding can have the same CFIP as a sensor pixel with a green or red color filter and the same shielding. Furthermore, CFIP can be defined downstream of a sensor pixel's microlens (if any), such that sensor pixels with offset microlenses can have the same CFIP as sensor pixels with non-offset microlenses.

Each sensor pixel 410, 420, 430, 440 in a particular sensor pixel cluster 400 can admit the same color (i.e., sensor pixel cluster 400 can have a common color filter). As explained below, a common color filter can include a plurality of distinct filter components arranged in a spaced-apart manner. In FIGS. 4A-4E, sensor pixel cluster 400 is shaded consistent with a green color filter (see FIGS. 6A-6C for a color legend). But sensor pixel cluster 400 can have any desired color filter such as blue, red, infrared, and the like. The term "color" is not limited to human-visible colors and should be understood to encompass any filter that admits a portion of light spectrum while blocking other portions. Thus, infrared filters are considered to be color filters. Another term for color filter is spectral filter.

Sensor pixel cluster 400 can lack a common color filter. Therefore, each sensor pixel cluster 400 can include two, three, four, etc. different color filters. First sensor pixel 410 and fourth sensor pixel 440 can each have a green color filter, one of second sensor pixel 420 and third sensor pixel 430 can have a red color filter, and the other of second sensor pixel 420 and third sensor pixel 430 can have a blue color filter. Put differently, each sensor pixel cluster 400 can have two diagonal green color filters, and one red color filter diagonal with a blue color filter.

FIG. 4A shows sensor pixel cluster 400a (i.e., sensor pixel cluster 400 in configuration 400a). First sensor pixel 410a and second sensor pixel 420a can form phase detection group 450a. A common microlens 403 can cover phase detection group 450a. Although not shown, the common microlens 403 can span the gap between first sensor pixel 410a and second sensor pixel 420a.

When viewed from the top plan perspective of FIG. 4A, microlens 403 of phase detection group 450a can be elliptical with a major axis (not labeled) extending across first sensor pixel 410a and second sensor pixel 420a and a minor axis (not labeled) extending between first sensor pixel 410a and second sensor pixel 420a.

When viewed from the top plan perspective of FIG. 4A, microlens 403 of third sensor pixel 430a and microlens 403 of fourth sensor pixel 440a can be circular. Third sensor pixel 430a and fourth sensor pixel 440a can be the same, except exposed area 401 of third sensor pixel 430a is larger exposed area 401 of fourth sensor pixel 440a.

The exposed areas 401 of third sensor pixel 430a and fourth sensor pixel 440b are shown as circular from a top plan perspective. However, exposed areas 401 can have any geometry such as a diamond shape, a triangle shape, a rectangle (e.g., a square) shape, a hexagonal shape, an octagonal shape, and the like. The masked areas 402 of third sensor pixel 430a and fourth sensor pixel 440b can be peripheral and thus surround an outer perimeter of exposed area.

FIG. 4B shows sensor pixel cluster 400b (i.e., sensor pixel cluster 400 in configuration 400b). First sensor pixel 410b and second sensor pixel 420b can form phase detection group 450b. Sensor pixel 410b can include a left side exposed area 401 and a right side masked area 402. Sensor pixel 420b can include a right side exposed area 401 and a left side masked area 402. As shown, the masked areas 402 of sensor pixels 410b and 420b are next to each other (e.g, horizontally consecutive). Since any sensor pixel cluster 400 configuration disclosed herein can be rotated 90, 180, or 270 degrees, masked areas 402 can be vertically consecutive. Phase detection group 450b, as with any phase detection groups discussed herein, can include horizontally arranged sensor pixels (as shown in FIG. 4B), vertically arranged sensor pixels (not shown), diagonally arranged sensor pixels (not shown), and so on.

FIG. 4C shows sensor pixel cluster 400*c* (i.e., sensor pixel cluster 400 in configuration 400*c*). First sensor pixel 410*c* and second sensor pixel 420*c* can form a phase detection group 450*c*. Sensor pixel 410*c* can include a left side exposed area 401 and a right side masked area 402. Sensor pixel 420*c* can include a right side exposed area 401 and a left side masked area 402. As shown, the exposed areas 401 of sensor pixels 410*c* and 420*c* face each other and the masked areas 402 of sensor pixels 410*c* and 420*c* oppose each other.

Figure 11:
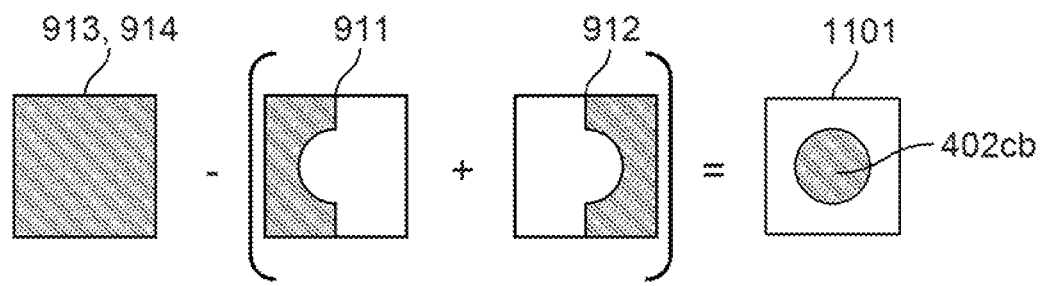
FIG. 11 graphically illustrates an example binning operation.

The masked areas 402 of sensor pixels 410*c* and 420*c* can each include a rectangular portion 402*ca* and a semi-circular portion 402*cb*. Each semi-circular portion 402*cb* can cover a two-dimensional centroid of the sensor pixel 410*c*, 420*c*. A sum of both semi-circular portions 402*cb* can be a circle (see FIG. 11). As a consequence of masked areas 402 in FIG. 4C, the exposed areas 401 of sensor pixels 410*c* and 420*c* can be U-shaped. Portion 402*cb* can be any shape that protrudes from rectangular portion 402*ca*. Portion 402*cb* can be, for example, rectangular (e.g., square), triangular, hexagonal, octagonal, and so on.

Figures 4D, 4E:
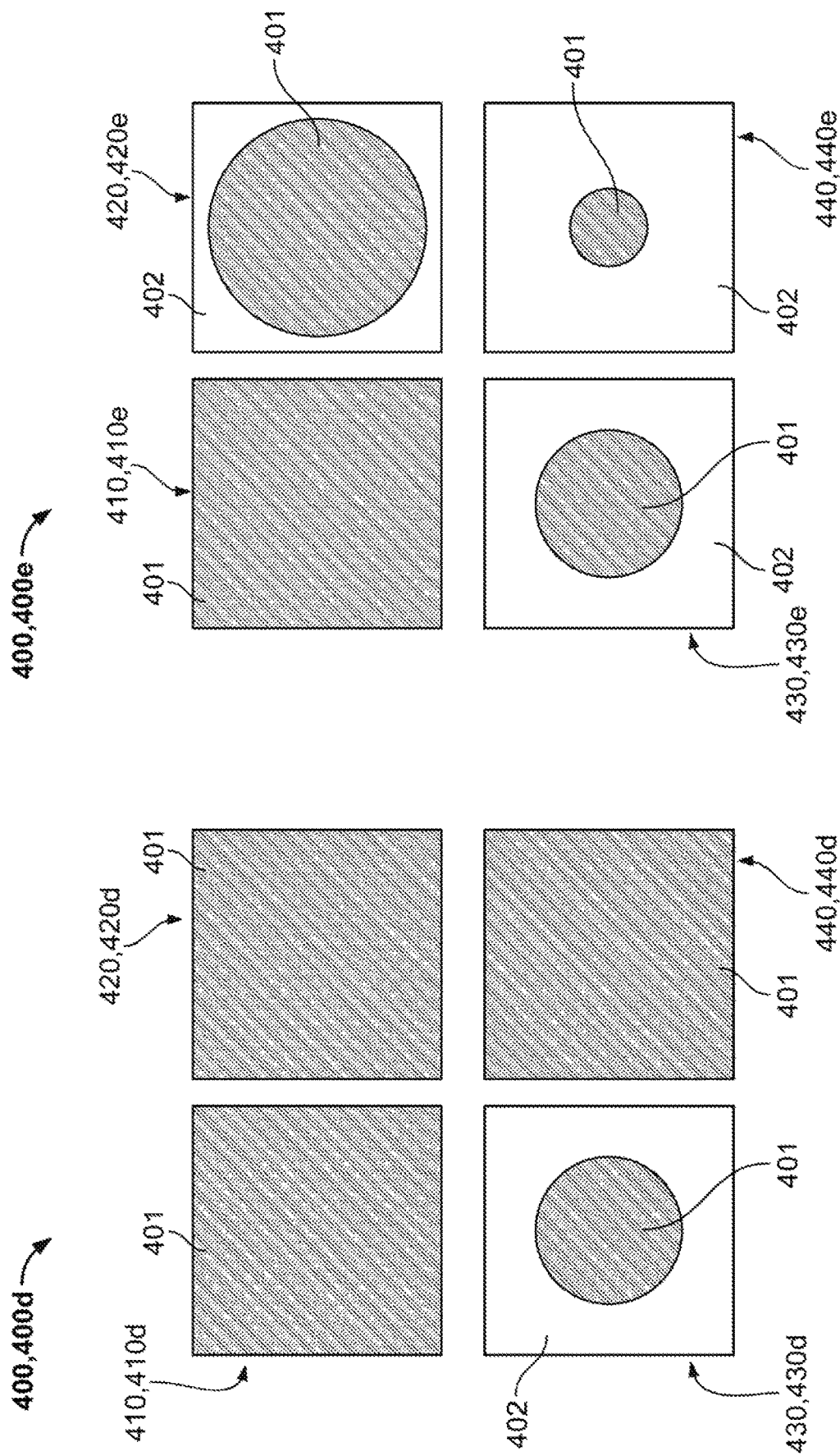

In FIG. 4C, third sensor pixel 430*c* and fourth sensor pixel 440*c* are unmasked. But sensor pixels 430*c* and 440*c* can have different sized exposed areas 401. Sensor pixel 430*c* be replaced with sensor pixel 430*e* or sensor pixel 440*e* (see FIG. 4E) and/or sensor pixel 440*c* can be replaced with sensor pixel 430*e* or sensor pixel 440*e* (see FIG. 4E).

FIG. 4D shows sensor pixel cluster 400*d* (i.e., sensor pixel cluster 400 in configuration 400*d*). First, second, and fourth sensor pixels 410*d*, 420*d*, and 440*d* can be identical to (i.e., have the same structure as) sensor pixels 430*c* and 440*c* of FIG. 4C. Third sensor pixel 430*d* can be identical to third sensor pixel 430*b* of FIG. 4B.

FIG. 4E shows sensor pixel cluster 400*e* (i.e., sensor pixel cluster 400 in configuration 400*e*). First sensor pixel 410*e* can be identical to sensor pixels 430*c* and 440*c* of FIG. 4C. Third sensor pixel 430*e* can be identical to third sensor pixel 430*d* of FIG. 4D.

Compared with third sensor pixel 430*e*, sensor pixel 420*e* can have a larger exposed area 401 and a smaller masked area 402 while sensor pixel 440*e* can have a smaller exposed area 401 and a larger masked area 402. Second sensor pixel 420*e* and fourth sensor pixel 440*e* can be otherwise identical to third sensor pixel 430*e*.

Only sensor pixel cluster 400*a* is shown to include microlenses 403. But sensor pixel clusters 400*a*-400*e* can include or omit microlenses 403. For example, each sensor pixel in sensor panels 400*b*-400*e* can include a dedicated microlens 403 having the circular shape applied to sensor pixels 430*a* and 440*a*. For sensor pixels with a central exposed area 401 and a peripheral masked area 402, microlens 403 can fully cover (from a top plan perspective), central exposed area 401 and at least partially cover (from the top plan perspective) peripheral masked area 402.

As shown in FIG. 4A with respect to sensor pixels 430*a* and 440*a*, each circular microlens 403 can have the same shape and configuration and thus be configured to project light in the same manner. To enhance the filtering effect of masked area 402, each circular microlens 403 can be configured to deposit incoming light on a central exposed area 401 and on at least an inner annular region of masked area 402. Thus, with respect to FIG. 4A, each circle 403 can represent an outer periphery of light projected by a microlens.

Sensor pixels 430*a*, 440*a*, 430*b*, 430*d*, 420*e*, 430*e*, and 440*e* are shown with central exposed areas 401 and peripheral masked areas 402. Each central exposed area 401 can include a two-dimensional centroid of a sensor pixel. Each central exposed area 401 can have a two-dimensional centroid coaxial (e.g., located at the same point) as a two-dimensional centroid of a sensor pixel.

Although central exposed areas 401 are shown as circular, central exposed areas 401 can have any geometry (e.g., a diamond, a rectangle (e.g., a square), a triangle, a hexagon, an octagon, and so on). As shown in FIGS. 4A, 4B, 4D, and 4E each peripheral masked area 402 can completely cover (from a top plan perspective) the non-central originally photosensitive area of each sensor pixel 410, 420, 430, 440.

Sensor pixels 410*b*, 420*b*, 410*c*, and 410*d* are shown with side exposed areas 401 and side masked areas 402. Such a configuration enables phase detection autofocus without a microlens 403.

Both peripheral and side masked areas 402 can be coplanar or non-coplanar with exposed areas 401. When the present application refers to a masked area 402 as being peripheral to an exposed area 401, the peripheral masked area 402 does not need to be coplanar with the exposed area 401.

As shown in FIGS. 4A-4E, each sensor pixel can have the same sized original photosensitive area (i.e., photosensitive area prior to application of shielding), represented by the combination of exposed area 401 and masked area 402. Alternatively, each sensor pixel can be printed to have a photosensitive area equal to exposed area 401. In this case, area 402 would map to an omitted or non-existent photoreceptive area.

A sensor pixel cluster 400 can be formed with any combination of the sensor pixels. For example, a sensor pixel cluster 400 can be formed by selecting one sensor pixel from FIG. 4A, one from FIG. 4B, one from FIG. 4C, and one from FIG. 4D.

Figure 5B:
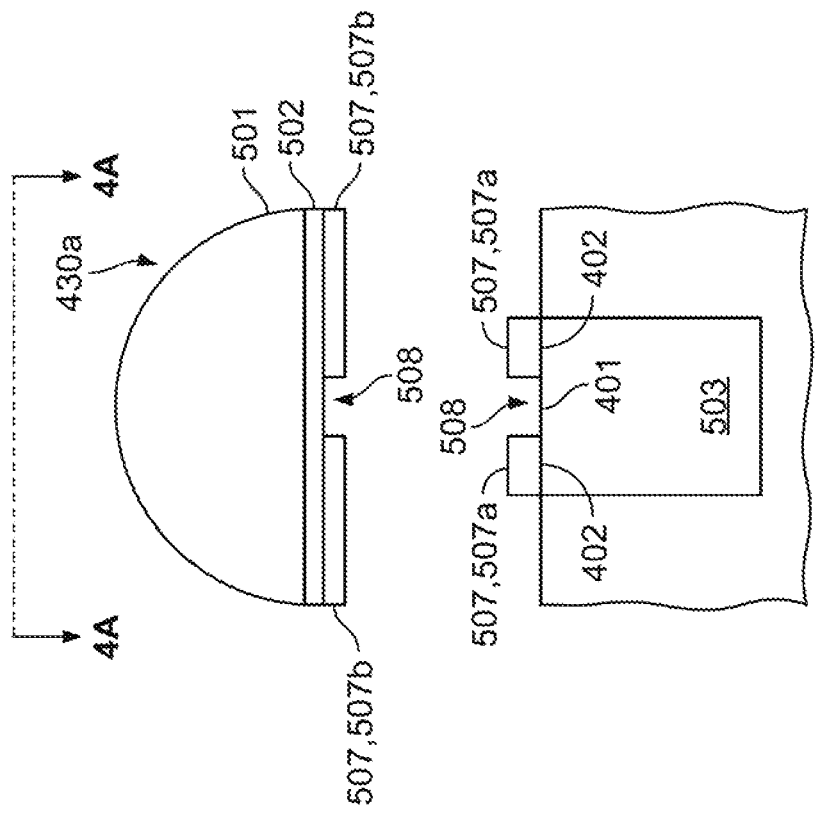

FIGS. 5A-5D show third sensor pixel 430 (e.g., third sensor pixel 430*a*). The other sensor pixels shown in FIGS. 4A-4E can be constructed according to the principles illustrated through FIGS. 5A-5E, although various features in FIGS. 5A-5E may be omitted, rearranged, or resized to accommodate each sensor pixel's design. The perspective of FIG. 4A is from plane 4A-4A in FIGS. 5A-5D. FIG. 5E is from the same top plan perspective as FIG. 4A.

Figure 5A:
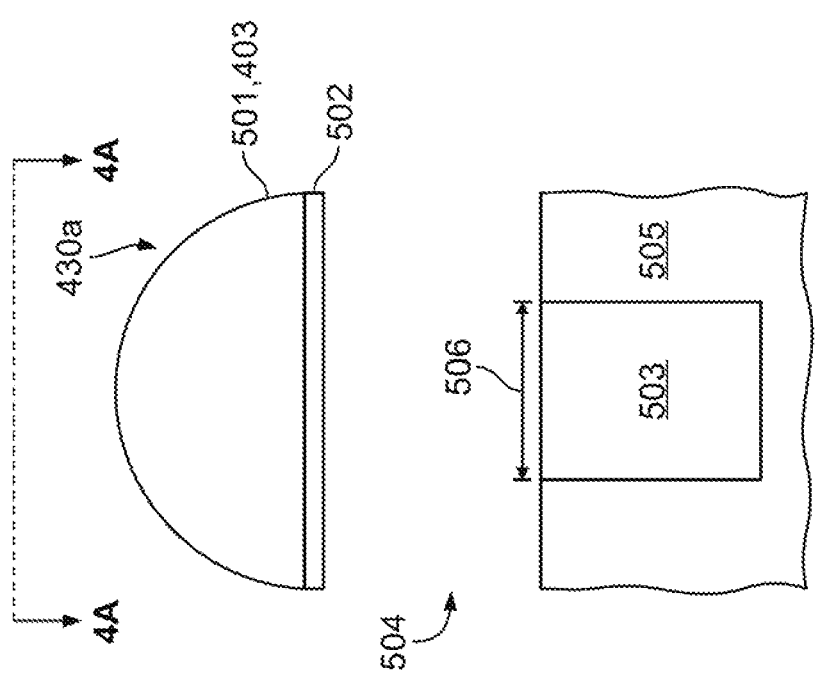
Figure 5E:
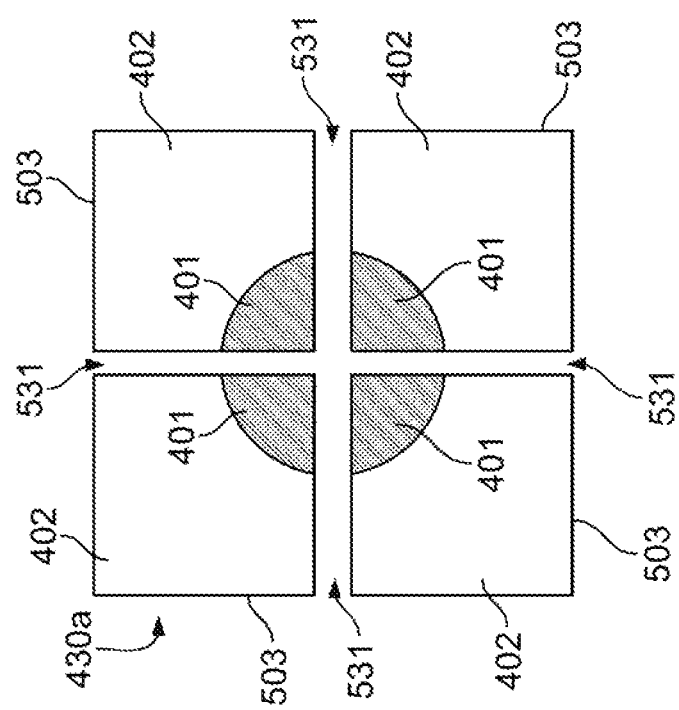

Referring to FIG. 5A, sensor pixel 430*a* can include a microlens 501, 403, a color filter 502, and a photodiode 503 (e.g., a CMOS or a CCD photosensor) defined in a silicon substrate 505. A spacer 504 can separate color filter 502 from photodiode 503 and silicon substrate 505. Spacer 504 can be an absence of material (i.e., a void) or a light transmitting material (e.g., a hardened resin). Photodiode 503 can have an original photosensitive area 506, which can be equal to the sum of exposed area 401 and masked area 402 in FIG. 4A. FIG. 5A omits shield 507.

FIGS. 5B and 5C show peripheral shield 507, which defines a central aperture 508. Shield 507 can be two-dimensionally coextensive with masked area 401. Aperture 508 can be two-dimensionally coextensive with exposed area 401. Aperture 508 can be a void or can be filled with spacer 504 material. In FIG. 5C, color filter 502 is disposed within aperture 508 instead of below microlens 501.

FIG. 5B shows two alternative dispositions of shield 507. Shield 507*a* is applied directly to photodiode 503. Shield 507*b* is applied beneath color filter 502. As another example (not shown), shield 507 can be applied directly underneath microlens 501 and color filter 502 can be applied (a) in the aperture defined by shield 507 or (b) directly above photodiode 503.

Since shield 507 can be spaced apart from photodiodes 503 of a sensor pixel, the exposed area 401 of a sensor pixel can be defined as the original photosensitive area of a sensor pixel plan projected onto a plane of shield 507. Similarly, the masked area 402 of a sensor pixel can be defined as the original photosensitive area of a sensor pixel plan projected onto the plane of shield 507.

As shown in FIGS. 5A-5D, each photodiode 503 can include a three-dimensional well extending into silicon substrate 505. Therefore, the original photosensitive area of a sensor pixel can, according to some examples, be defined as a plan projection of an upper original photosensitive surface of the sensor pixel's photodiodes 503 plan projected onto the plane of shield 507.

As discussed, area 402 can represent an omitted portion 507 of a photodiode 503. In FIG. 5D, photodiode 503 has been resized to have an original photosensitive area 506 coextensive with exposed area 401.

As shown in FIG. 5E, a single sensor pixel 430a can include a plurality of different photodiodes 503, each shielded to produce the desired aggregate exposed area 401 and the desired aggregate masked area 402. For clarity, FIG. 5E omits microlens 501, 403.

In FIG. 5E, an outer portion the original photosensitive area of each photodiode 503 can be shielded so that the sum of the exposed areas 401 of photodiodes 503 is circular and the sum of the masked areas 402 of photodiodes 503 is peripheral. As a result, the exposed area 401 of sensor pixel 430a circular and the masked area 402 of sensor pixel 430a peripheral. Due to gaps or channels 531 defined between adjacent photodiodes 503, exposed areas 401 may not sum to a perfect circle.

Photosensitivity can be modified with other techniques. For example, the photocharge well capacities of each photodiode can be adjusted. Photodiodes with a high aperture level can have a deeper well capacity and photodiodes with a low aperture level can have a shallower well capacity or vise-versa.

Figure 6A:
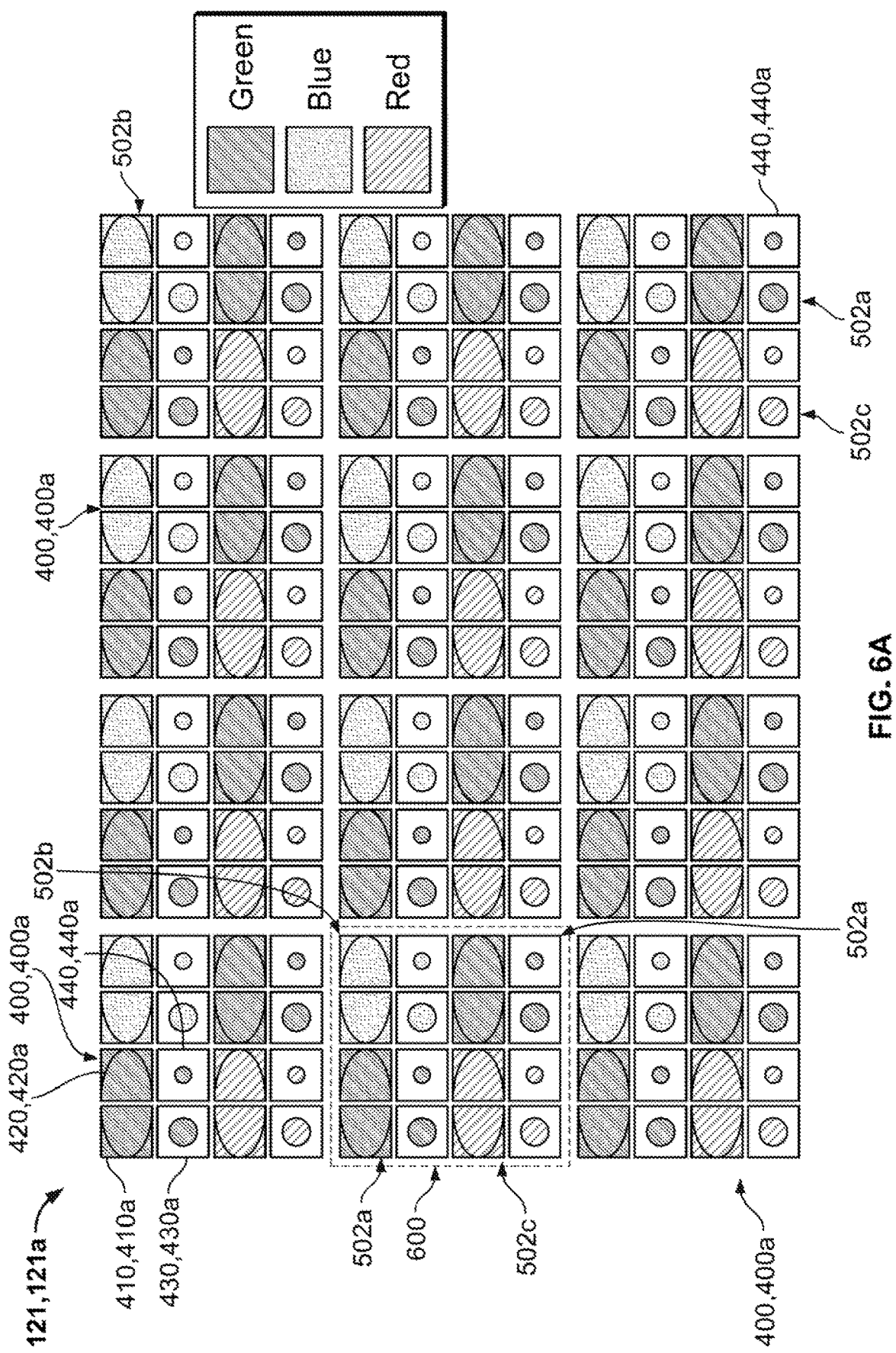
FIGS. 6A-6C show example sensor panel configurations.
Figure 6B:
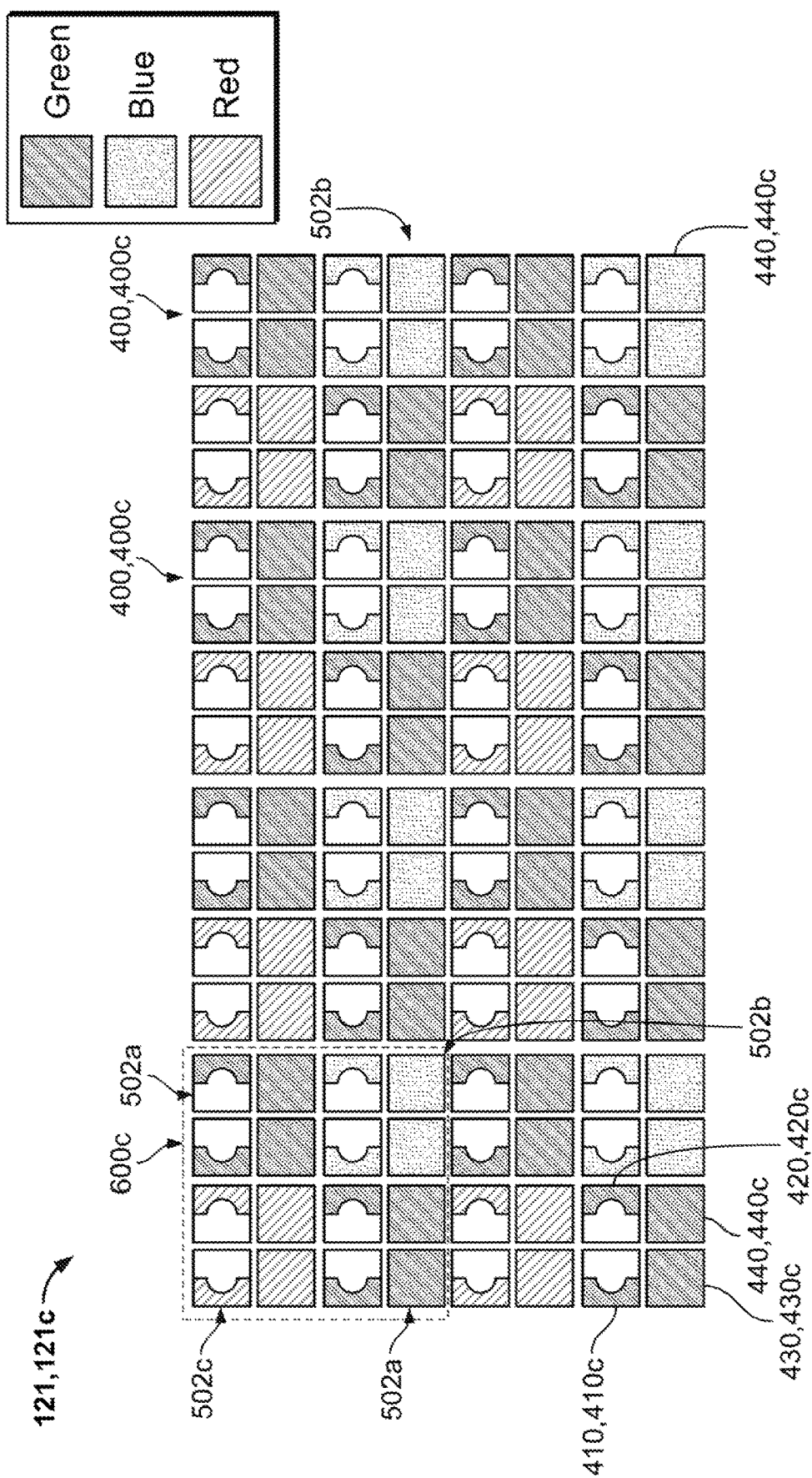
Figure 6C:
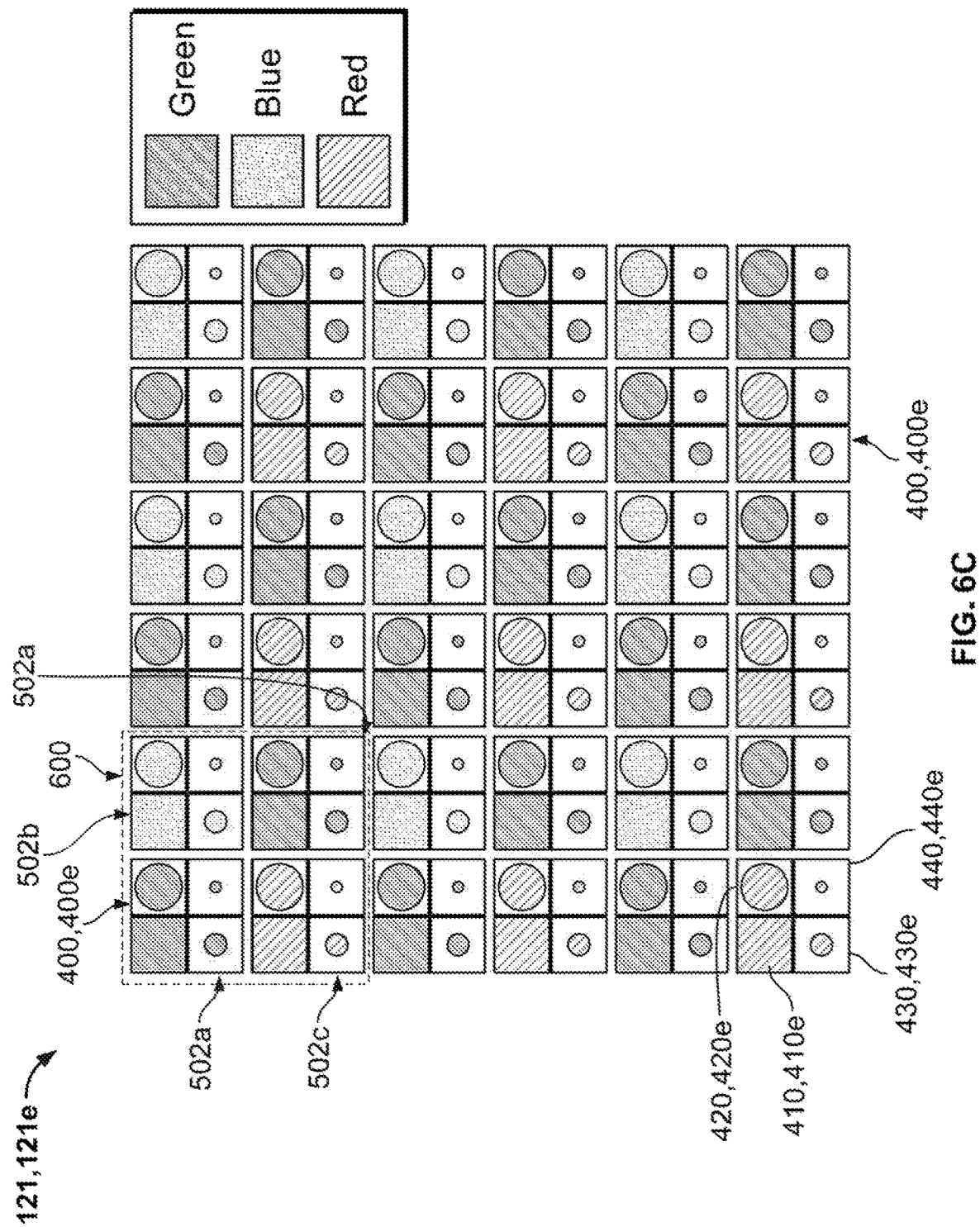

FIGS. 6A-6C show example sensor panels 121a, 121c, and 121e (generically referred to as sensor panel(s) 121) with Quad (sometimes called Quadra) spectral patterns (also called color patterns). A Quad spectral pattern can include a repeating group of sixteen spectral units, including eight of a first color (e.g., green), four of a second color (e.g., blue), and four of a third color (e.g., red). As further discussed below, a spectral pattern can describe multiple features such as an image mosaic or a color filter array.

In the case of FIGS. 6A-6C, the Quad spectral pattern represents a color filter array (i.e., a Quad color filter array or Quad CFA). Accordingly, sensor panels 121 can include a repeating sensor pixel group 600 including eight green sensor pixels (here, colors refer to the kind of color filter 502 in the sensor pixel), four blue sensor pixels and four red sensor pixels. The views in FIGS. 6A-6C can be fragmentary and sensor panel 121 can include millions of different sensor pixel clusters 400. As discussed below, sensor panel 121 is not limited to a Quad CFA and can define other kinds of spectral patterns such as Bayer, and so on.

According to FIGS. 6A-6C each sensor pixel cluster 400 can include a green 502a, blue 502b, or red 502c common color filter (which is not necessarily a unitary piece, as discussed above). Any of the sensor pixel clusters 400a-400e can be green 502a, blue 502b, or red 502c. Thus, in FIGS. 6A-6C, element number "400" is intended to convey a spatial configuration of a sensor pixel cluster, while element number "502" is intended to convey color filter channel.

Referring to FIGS. 6A-6C, the eight green sensor pixels can be arranged in two green 502a sensor pixel clusters 400. The four blue sensor pixels can be arranged in a single blue 502b sensor pixel cluster 400. The four red sensor pixels can be arranged in a single red 502c sensor pixel cluster 400.

The two green 502a sensor pixel clusters 400 can be diagonal. The red 502c sensor pixel cluster 400 can be diagonal to the blue 502b sensor pixel cluster 400. As shown across FIGS. 6A-6C, the relative locations of the green, blue, and red sensor pixel clusters 502a, 502b, and 502c can switch. For example, for any sensor pixel group 600, the blue 502b sensor pixel cluster 400 can have a top left, top right, bottom left, or bottom right relative position and the remaining green 502a sensor pixel clusters 400 and remaining red 502c sensor pixel cluster 4000 can be arranged consistent with above the above diagonal relationships.

Although not shown, sensor panel 121 can have any kind of color filter arrangement. Sensor panel 121 can have no color filters. Each sensor pixel of sensor panel 121 can have the same color filter. Sensor panel 121 can have a RGB-IR filter array in which one of the Bayer greens is removed to yield a sensor pixel with no color filter. Sensor panel 121 can have a RGBC filter array where a clear color filter replaces one Bayer green. Sensor panel 121 can have a RCCB filter array where both greens are replaced with a clear filter.

FIG. 6A shows sensor panel 121 with configuration "a", where each sensor pixel cluster 400 has configuration "a" of FIG. 4A. FIG. 6B shows sensor panel 121 with configuration "c", where each sensor pixel cluster 400 has configuration "c" of FIG. 4C. FIG. 6C shows sensor panel 121 with configuration "e", where each sensor pixel cluster 400 has configuration "e" of FIG. 4E. Sensor panels 121 with configurations "b" (of FIG. 4B) and "d" (of FIG. 4D) are not shown, but can be constructed in accordance with the principles discussed with reference to FIGS. 4A-6C.

Although not shown, each sensor panel 121 can include separate Quad patterns separated by lines of unshown sensor pixels (e.g., infrared sensor pixels, white sensor pixels). FIGS. 6A-6C omit views of silicon substrate 505 and associated circuitry extending between adjacent sensor pixel clusters 400.

Sensor panel 121 can have one or more Bayer patterns instead of the one or more Quad patterns. In this case, the above-discussed diagonal relationships can apply to each individual sensor pixel cluster 400 (i.e., each individual sensor pixel cluster would include two green 502a sensor pixels, one blue 502b sensor pixel, and one red 502c sensor pixel). Configurations 121a, 121c, and 121e of sensor panel 121 are shown as having different geometries (e.g., configurations 121a and 121c are shown as non-square rectangles, while configuration 121e is shown as a square rectangle). Sensor panel 121 can have any desired geometry.

As discussed, mobile device 100 can include a processing system 1800, which can include sensor panel 121 along with one or more processors configured to convert photometrics captured by sensor panel 121 into a full-color image. The processors can include one or more general purpose processors and/or one or more application integrated circuits.

Some of the processors can be integrated into sensor panel 121. Other processors can be external to sensor panel 121. The one or more processors of processing system 1800, and thus mobile device 100 can be configured to perform any and all methods and operations disclosed in this application.

Discussed below are method (e.g., a series of operations) for image processing and thus converting photometrics captured by the pixels (e.g., pixels 410, 420, 430, and 440) of sensor panel 121 into a full-color image. In the discussion that follows hardware pixels (e.g., pixels 410, 420, 430, and 440) are referred to as sensor pixels, while software pixels (e.g., pixels representing units of data in an image) are referred to as image pixels. As used herein, the term photometrics can refer to analog photometrics (e.g., charge levels of sensor pixels, readout voltages, and the like) or digital photometrics (e.g., spectral values).

An image can include a plurality of different image pixels. Each image pixel can spatially map to one sensor pixel. For an example, an image pixel with coordinates (1, 1) can map to a sensor pixel with coordinates (1, 1), an image pixel with coordinates (x, y) can map to a sensor pixel with coordinate (x, y), and so on. After binning (discussed below), each image pixel can spatially map to a plurality of (e.g., four) sensor pixels.

Each image pixel can have one or more color channels. A color channel can be one of a plurality of predetermined options, determined according to a desired color space. In RGB color space, each image pixel can include a red, a green, and/or a blue color channel. Other color spaces (e.g., CIE) are consistent with the present disclosure.

Each color channel can have a color value falling within a predetermined range such as 0-255 (8-bits per channel), 0-511 (9-bits per channel), 0-1023 (10-bits per channel), 0-2047 (11-bits per channel), and so on. The color value can indicate a magnitude of the color channel. For example, 0 can indicate an absence of the color channel. For clarity, image pixels are considered to include color channels with a color value of zero.

Certain image and/or sensor pixels can be favored others. Put differently, certain image and/or sensor pixels can be weighted differently. Some image/sensor pixels can receive a greater weight (i.e., be favored) and other image/sensor pixels can receive a less weight (i.e., be disfavored) Examples of weighting (i.e., favoring) are discussed below. For example, photometrics from higher weighted (i.e., favored) sensor pixels can be used to produce image pixels, while photometrics from lesser weighted (i.e., disfavored) sensor pixels can be discarded.

Let A.1 represent an array (i.e., a collection) of higher weighted sensor pixels and B.1 represent an array of lesser weighted sensor pixels. Let A.2 represent an array of image pixels mapping to array A.1 and let B.2 represent an array of image pixels mapping to array B.1

According to some examples, sensor pixel array A.1 can be defined to consist of each first sensor pixel 410 and sensor pixel array B.1 can be defined to consist of each second sensor pixel 420. According to these examples, image pixel array A.2 can consist of each first image pixel 911 and image pixel array B.2 can consist of each second image pixel 912. Sensor pixel array A.1 can be weighted over sensor pixel array B.1 according to many different techniques. Some examples are discussed below. Image pixels 911 and 912 appear in FIG. 9, which is further discussed below.

According to a first technique, sensor pixel array A.1 can be integrated and array B.1 can be non-integrated. Due to the non-integration, array B.2 can never be formed (and thereby receive an effective weight of zero). Examples of integration are further discussed below with reference to FIG. 7B. In general, integration is the process by which sensor pixels measure light.

According to a second technique, both sensor pixel array A.1 and sensor pixel array B.1 can be integrated to form a first mosaic 905 (which can be in digital or analog form). First mosaic 905 appears in FIG. 9 and is further discussed below. During the remosaicing process, image pixels in array A.1 can be assigned a higher weight and image pixels in array B.2 can be assigned a lower weight (e.g., zero weight) during the remosaicing. Image pixels in array A.1 can be weighted over image pixels in array B.2 because the image pixels in array A.1 have a desired aperture level, while the image pixels in array B.2 do not.

According to a third technique, array A.2 and array B.2 can both be demosaiced into full-color images. Let full-color image A.3 be the demosaic of array A.2 and full-color image B.3 be the demosaic of array B.2. Image pixels in images A.3 and B.3 can then be combined, where image pixels in full-color image A.3 are assigned a higher weight and image pixels in full-color image B.3 are assigned a lower weight during the combination. Image pixels in image A.3 can be weighted over image pixels in image B.3 because the image pixels in image A.3 are closer to a desired aperture level than image pixels in image B.3.

Images can have a plurality of different stages and exist in a plurality of different states. Stages can include a mosaic stage and a full-color stage. States can include a transient state and a stable state. When the present disclosure refers to an image, the image can be a portion or patch of a larger image. Alternatively, the image can represent an entire and complete image.

In a mosaic stage, each image pixel includes fewer color channels than are required for a full-color image (as determined by the desired color space). According to some examples, each image pixel in an image mosaic (i.e., an image in a mosaic stage) includes a single color channel, and thus a single color value. In a full-color stage, each image pixel includes a number of color channels equal to the number required by the desired color space. For example, in RGB color space, each image pixel includes three color channels.

Figures 8A, 8B:
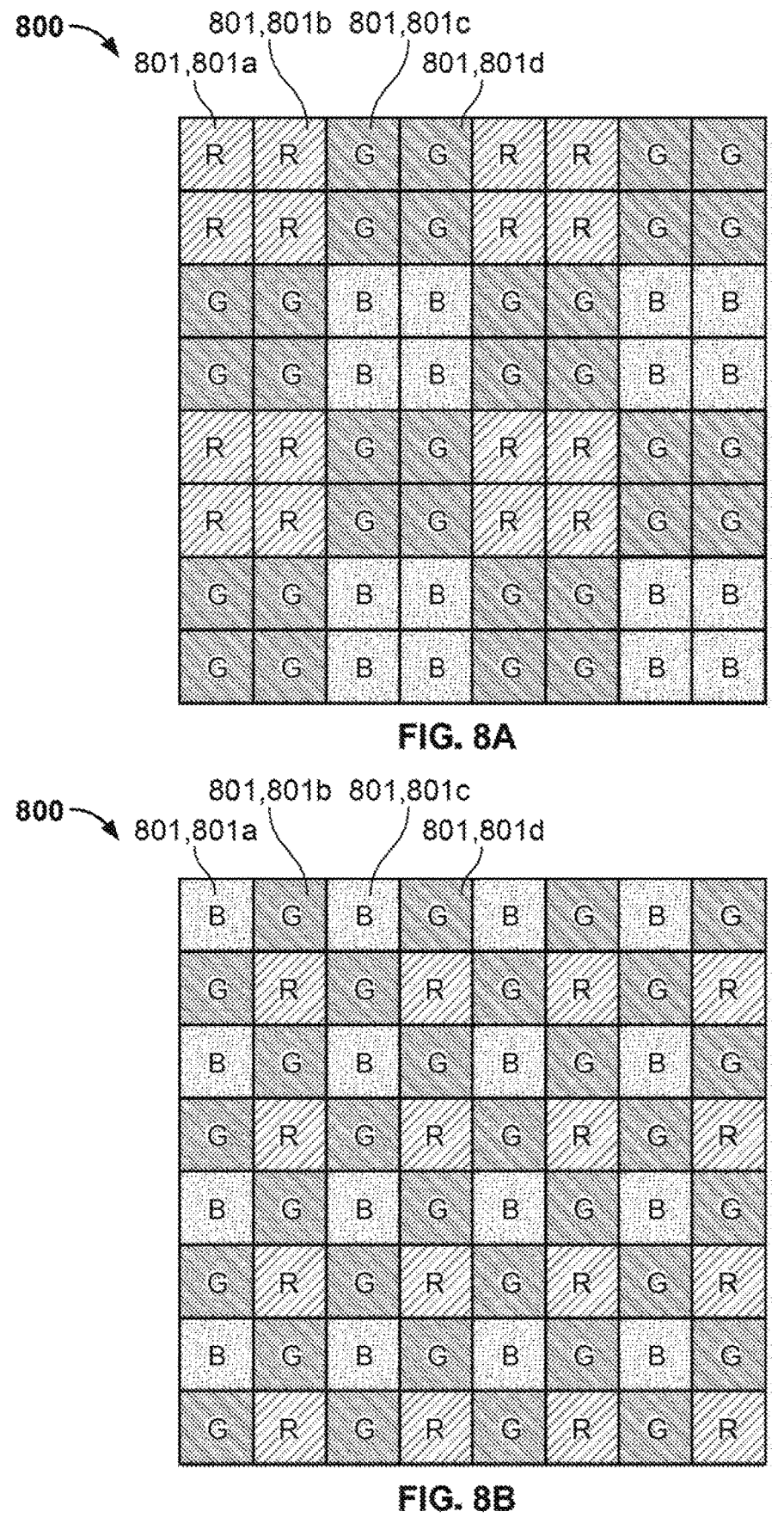

A mosaic can have a color pattern. For example, a mosaic can have a Quad color pattern, a Bayer color pattern, and the like. FIG. 8A shows an image 800 in a Quad mosaic state. FIG. 8B shows the image 800 remosaiced into a Bayer mosaic state. The image includes image pixels 801, including a first image pixel 801a, a second image pixel 801b, a third image pixel 801c, and so on.

Each image pixel 801 can have a Quad color channel (e.g., a first color channel) in the Quad mosaic state and a Bayer color channel (e.g., a second color channel) in the Bayer mosaic state. The first and second color channels can be the same or different. For example, the Quad and Bayer color channels for fourth image pixel 801d are the same in FIGS. 8A and 8B. As such, fourth image pixel 801d can have the same color values in FIGS. 8A and 8B.

For clarity, the present disclosure sometimes refers to adjusted image pixels as a new or different image pixel. Thus image pixels 801a-801d in FIG. 8A can be referred as original first-fourth image pixels and image pixels 801a-801d in FIG. 8B can be referred to as new first-fourth image pixels (assuming FIG. 8A is remosaiced into FIG. 8B).

Any stage of an image can be in a transient state, where the image exists as signals in processing system 1800 (see FIG. 18) or a stable state, when the image is preserved in memory (e.g., volatile memory or non-volatile memory). A portion of an image can be in transient form while another portion of the image is in stable form.

Whether in transient form or stable form, an image can have a resolution, which quantifies the detail that the image holds. The smallest unit of resolution can be an image pixel. Stable image and transient images can have image pixels stored in compressed form. For example, a JPEG is a full-color image. The three color channels of each image pixel are stored in a compressed format (e.g., in the frequency domain). Upon accessing a JPEG, processing system 1800 can use a codec to unpack the three color channels of each image pixel.

Figure 7A:
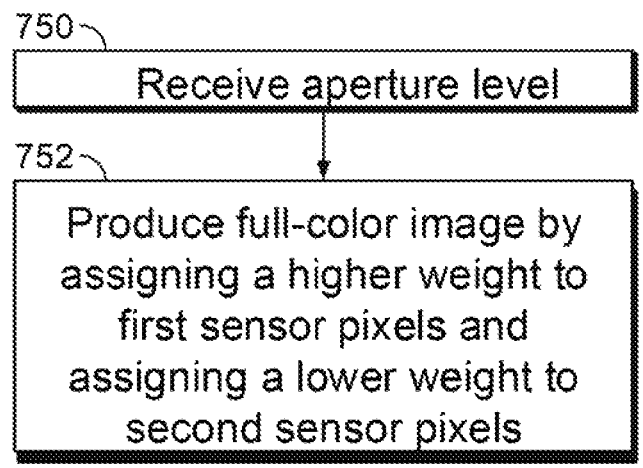
FIG. 7A is a block diagram of an example method.

FIG. 7A shows an image processing method. At block 750, processing system 1800 can receive an aperture level (e.g., a user-selected aperture level, also called a desired aperture level). At block 752, processing system 1800 can produce (e.g., prepare, assemble, generate) a full-color image by assigning a greater weight (i.e., favoring) first sensor pixels and assigning a lesser weight (i.e., disfavoring) second sensor pixels. The greater weight can exceed the lesser weight. The favoring and disfavoring (i.e., the weighting) can be based on a received aperture level.

Each of the first sensor pixels and the second sensor pixels can be an aspect of an image sensor panel. The first sensor pixels can have a first color-filter-independent-photosensitivity and the second sensor pixels can have a second color-filter-independent-photosensitivity. The first color-filter-independent-photosensitivity can be larger or smaller than the second color-filter-independent-photosensitivity.

Figure 7B:
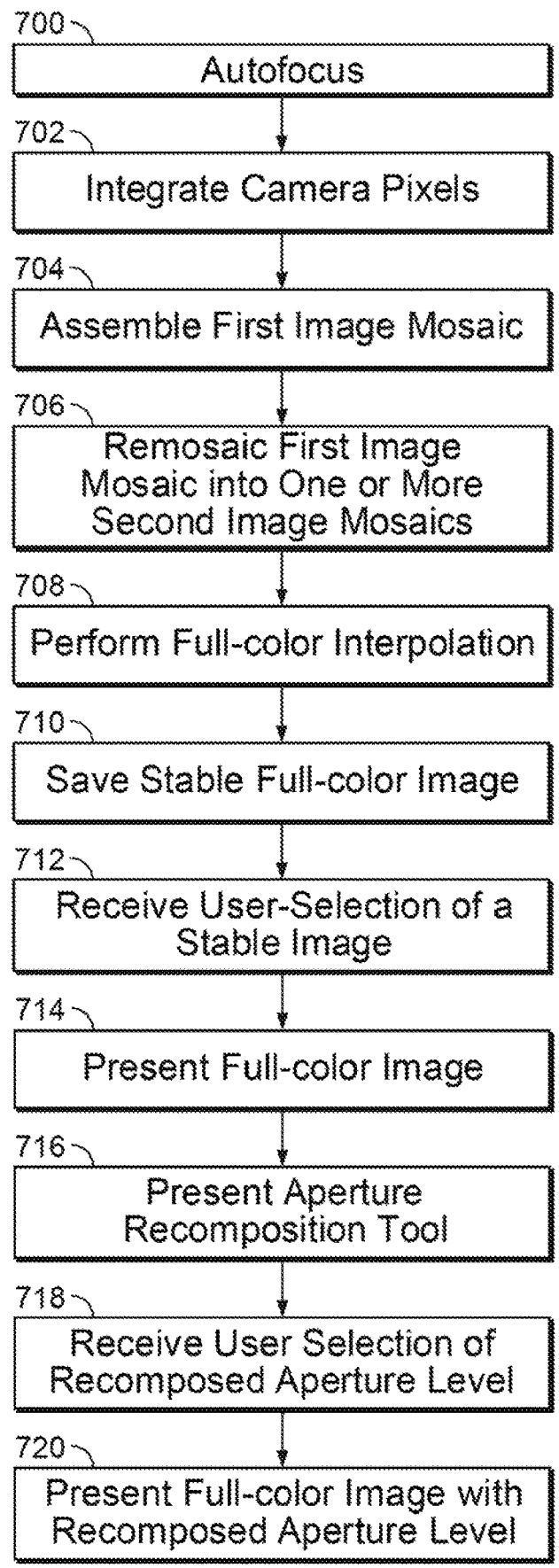
FIG. 7B is a block diagram of an example method.

FIG. 7B shows an image processing method. At block 700, processing system 1800 can autofocus based on the phase-detection sensor pixel groups 450 (if present). At block 702, processing system 1800 can integrate the sensor pixels. Integration can include (a) clearing, (b) exposure, and (c) readout. Integration can occur over an integration window. The integration window can begin with the clearing and conclude with the readout.

When integration begins, the photocharge of a sensor pixel can be cleared such that the sensor pixel has no photocharge. During an integration window, the one or more photodiodes of a sensor pixel can convert incident light into photocurrent and store the photocurrent as photocharge.

When the integration window (also called exposure window) concludes, processing system 1800 can read out the one or more analog photocharge levels in the sensor pixel and convert the photocharge level into a digital photometric. The digital photometric can be a color value of an image pixel mapped to the sensor pixel. The kind of color filter in the sensor pixel can be the color channel of the image pixel.

Integration can be global or rolling over sensor panel 121. When global, each sensor pixel can begin and/or conclude integration at the same time (e.g., substantially at the same time). When rolling, different regions of sensor panel 121 can begin and/or conclude integration at the same time. When rolling, each pixel cluster 400 can be concurrently integrated (discussed below).

Processing system 1800 can integrate based on a user-command. Mobile device 100 can enable the user to select between HDR (high dynamic range) and non-HDR. If the user selects HDR, then processing system 1800 can apply a same-sized integration window to each sensor pixel.

If the user selects non-HDR, then processing system 1800 can apply an integration window to each sensor pixel based on exposed area 401 of the sensor pixel. The integration window can be inversely proportional to (or otherwise a mathematical function of) exposed area 401. For phase detection pixels, the integration window can be proportional to (or otherwise a mathematical function of) the combined exposed areas 401 of the phase detection group 450. FIG. 10A

FIG. 10A shows possible integration windows T1-T4 when the user selects non-HDR. T1 is shorter than T2, which is shorter than T3, which is shorter than T4. The times are not necessarily equal across different sensor panels. Thus, T1 for sensor panel 121a can be different than T1 for sensor panels 121b, 121c, 121d, and 121e, and so on.

According to some examples, a user can select an HDR strength. Any user-selection discussed herein can be replaced with an automatic or machine selection. For example, processing system 1800 can automatically select an HDR strength. A maximum HDR strength can cause each sensor pixel to have the same-sized integration window. Any HDR strength less than the maximum can cause mobile device 100 to integrate as shown in FIG. 10A. The relative disparity between the times shown in FIG. 10A can be based on the desired HDR strength.

For example, if the desired HDR strength is high (but below maximum), the difference between consecutive times (e.g., T1 and T2 or T2 and T3) can be small. If the desired HDR strength is low (e.g., zero), then the difference between consecutive times can be a maximum (and in some examples, inversely proportional to exposed area 401). Here, "maximum" and "minimum" refer to sensor-panel 121 produced HDR level. According to some examples, a user can enhance HDR above the maximum HDR level through post-processing (i.e., at the image pixel level).

Processing system 1800 can be configured to concurrently integrate each sensor pixel in a given pixel cluster 400 during rolling integration. With concurrent integration, each sensor pixel in a given pixel cluster 400 can begin integration at the same point in time and/or end integration at the same point in time. According to these examples, each integration window of sensor pixels in a pixel cluster 400 overlaps in time. Ending integration at the same point in time can enable processing system 1800 to simultaneously read out each sensor pixel of a pixel cluster 400.

When integration of each sensor pixel is finished, and at block 704, processing system 1800 can assemble a first image mosaic 905 (discussed below with reference to FIG. 9). The first image mosaic 905 can have a color pattern matching the color filter array of the sensor panel. For sensor panels 121a, 121c, and 121e (i.e., sensor panels with a Quad color filter pattern), the first image mosaic can have a Quad pattern.

Processing system 1800 can save the first image mosaic 905 in digital form as a stable file (e.g., in non-volatile memory). Processing system 1800 can perform the save to enable future remosaicing of the image according to a different technique. According to some examples, and at block 704, processing system 1800 is configured to load a saved stable image mosaic.

Remosaicing and demosaicing are discussed below. During a remosaicing operation, each image pixel can begin and end with a single color channel. During a demosaicing operation, each pixel can begin with a single color channel and end with a plurality of (e.g., three) color channels.

Some or all of the remosaicing operations can occur prior to analog-to-digital conversion of the pixel photocharges (i.e., when first image mosaic is in an analog state). Some or all of the remosaicing operations can occur after the analog-to-digital conversion of the pixel photocharges (i.e., when first image mosaic is a digital state).

Figure 9:
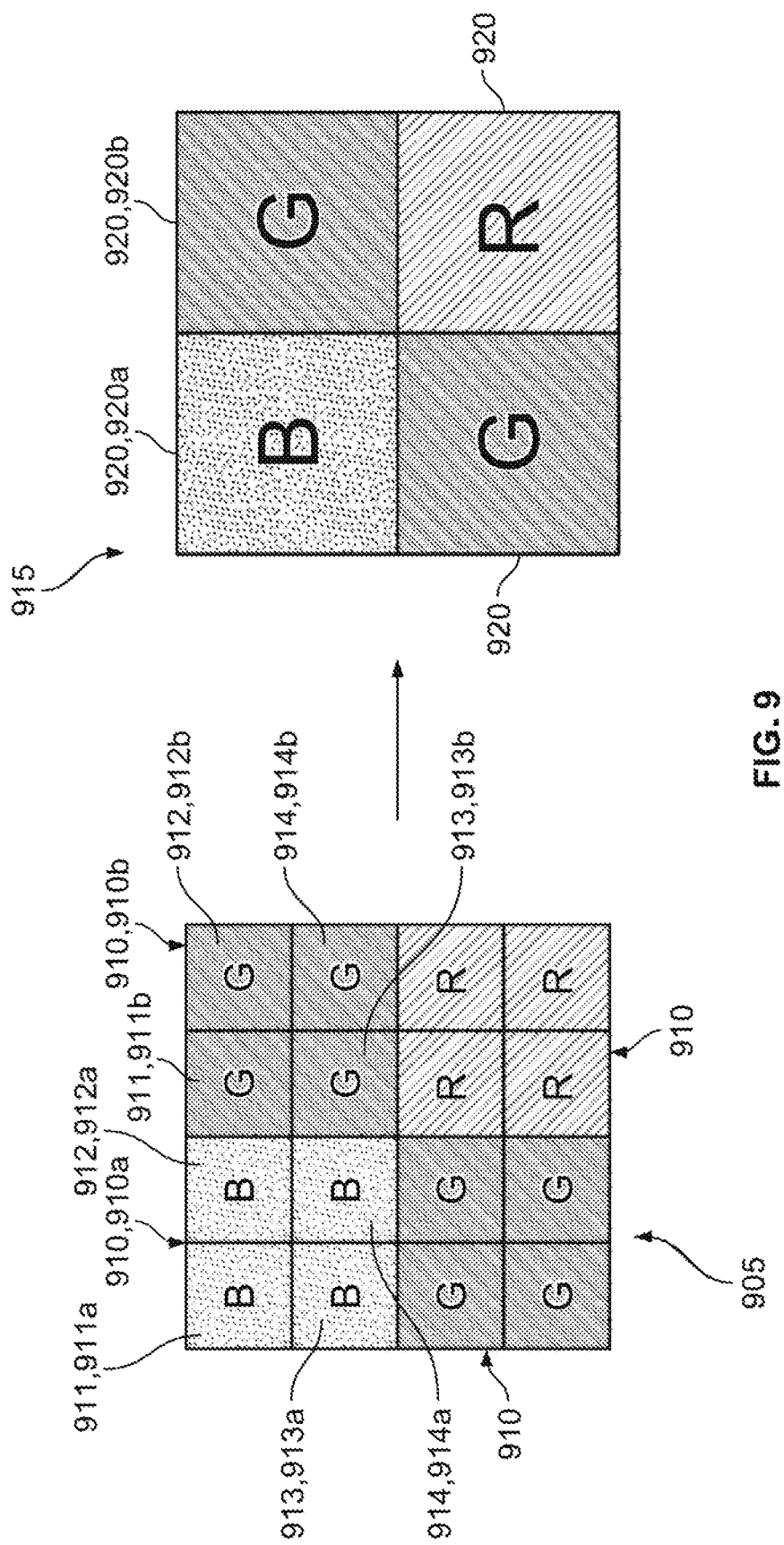
FIG. 9 shows an example of remosaicing.

Referring to FIG. 9, in the examples that follow, original image pixels 911, 912, 913, and 914 of first mosaic 905 respectively map to sensor pixels 410, 420, 430, and 440. The following examples discuss maximum and minimum aperture levels (also called aperture simulations). These maximums and minimums apply to the original or source aperture levels physically produced by pixel clusters 400 (i.e., at the sensor pixel level). If a maximum aperture level is applied, processing system 1800 can further enhance the aperture level through post-processing (i.e., at the image pixel level). The reverse applies to minimum aperture level.

At block 706, processing system 1800 can remosaic by binning the first mosaic 905 into a second mosaic 915 (see FIG. 9). The first mosaic 905 can have a Quad pattern (FIG. 8A) and the second mosaic 915 can have a Bayer pattern (FIG. 8B).

To bin, processing system 1800 can merge a plurality of original image pixels 911-914 in a Quad first mosaic 905 into a new image pixel 920 in a second Bayer mosaic 915. The sensor pixels of sensor panel 121 can prepare the first mosaic 905. The first mosaic 905 can be loaded from a stable file. During block 706, the first mosaic can be digital or analog. If analog, block 706 can occur during block 702 and/or block 704.

Referring to FIG. 9, processing system 1800 can segment the first mosaic 905 into a plurality of image pixel clusters 910. Each image pixel cluster 910 can have common color channel. Processing system 1800 can bin to merge each image pixel cluster 910 into a new image pixel 920 in second mosaic 915.

For example, processing system 1800 can merge image pixel cluster 910a (including original image pixels 911a, 912a, 913a, and 914a) into new image pixel 920a and merge image pixel cluster 910b into a new image pixel 920b. The new image pixel 920 can have the same color channel as the merged pixel cluster. The new image pixel 920 can have a color value based on one or more of the merged original image pixels 911-914.

The new image pixel 920 can have a spatial size equal to the sum or original image pixels 911-914. Binning can therefore cause an image mosaic in Quad to remosaic into Bayer with 75% percent resolution loss. Original image pixels 911-914 can be the analog photometrics directly after digital conversion. Alternatively, original image pixels 911-914 can be the analog photometrics after digital conversion plus additional post-processing (e.g., color balancing).

Processing system 1800 can bin based on a user selection via aperture simulation tool 151. Processing system 1800 can enable the user to select between a first aperture level, a second aperture level, a third aperture level, a fourth aperture level, a fifth aperture level, . . . an Nth simulated aperture (in order with first being highest and Nth being lowest or vice versa) via tool 151.

During binning, processing system 1800 can sum the color values of the one or more selected original image pixels 911-914 and divide by the number of summed color values to yield an averaged color value. Processing system 1800 can then set the color value of the new image pixel 920 as the averaged color value. In this way, binning can merge original image pixels 911-914 into a single new image pixel 920.

During binning, processing system 1800 can blend image pixels (i.e., color values thereof) to arrive at a desired aperture level. For example, if the user selects an aperture level (e.g., via tool 151) between two source apertures, processing system 1800 can take a weighted average of two or more aperture levels.

Source aperture level is intended to convey the aperture level produced by one or more sensor pixels having the same sized exposed area 401. Thus, some sensor panels 121 can only produce two source aperture levels, while other sensor panels 121 can produce any desired number of source aperture levels (e.g., sensor panel 121e can produce four aperture levels).

FIG. 10B shows example binning operations for each sensor panel configuration 121a-121e. For sensor panel 121c (FIG. 4C), a maximum user-selected aperture level can cause processing system 1800 to (a) select image pixels 913 and discard the others, (b) select image pixels 914 and discard the others, or (c) select both image pixels 913 and 914 and discard the others. As previously discussed, any user-selection discussed herein (e.g., user-selected aperture level) can be replaced with an automatic selection by processing system 1800.

According to option (a), new image pixels 920 can have color values equal to the color values of third original image pixels 913. According to option (b), new image pixels 920 can have color values equal to the color values of fourth original image pixels 914. According to option (c), each new image pixels 920 can have a color value equal to a blend or equally weighted average of a pair of third and fourth original image pixels 913 and 914.

For sensor panel 121a, a maximum user-selected aperture level can cause processing system 1800 to select original image pixels 911 and 912 (i.e., merge original image pixels 911-914 into a new image pixel 920 with a color channel value based on original image pixels 911 and 912 and not based on original image pixels 913 and 914). For sensor panel 121b, processing system 1800 can select original image pixel 914. For sensor panel 121c, processing system 1800 can select original image pixels 913 and 914. For sensor panel 121d, processing system 1800 can select original image pixels 911,912, and 914. For sensor panel 121e, processing system 1800 can select original image pixel 911. As discussed, color values from non-selected pixels can be ignored.

Processing system 1800 can blend through addition and subtraction. For example, and referring to FIGS. 4C and 11, processing system 1800 can take an average of original image pixels 913 and 914 (i.e., the color values thereof), then subtract original image pixels 911 and 912 from the average. This can produce a color value simulating aperture level of a sensor pixel 1101 having an exposed area 401 equal to the sum of semi-circular masked portions 402cb.

The same principles apply to the other operations illustrated in FIG. 10B. As shown in FIG. 10B, some selections cause blending. Blending can include taking a weighted average between source apertures levels, as shown in the chart. For example, a low aperture level for sensor panel 121d can cause a blend between the maximum aperture level (calculated according to any one of three different techniques) and a minimum aperture level. In this case, each original image pixel 911-914 involved in the blend can be selected for color value merger. As discussed, unselected original image pixels can be discarded (i.e., the color values thereof can be discarded).

During a blend, a weight can be applied to multiple source apertures levels. Let SA.1 be an array of the photometrics of each source first aperture level image pixel 911-914. If the first aperture level is a maximum, and for sensor panel 121a, SA.1 can be an array of: (a) original image pixels 911, (b) original image pixels 912, or (c) the average of each pair of original image pixels 911 and 912. Recall that for sensor panel 121a, original image pixels 911 and 912 respectively map to sensor pixels 410a and 420a. Sensor pixels 410a and 420a have the largest exposed areas 401 in sensor pixel clusters 400a.

Let SA.2 be an array of the photometrics of each source second aperture level image pixel 911-914. If the second aperture level is a minimum, and for sensor panel 121a, SA.2 can be an array of original image pixels 914. Recall that for sensor panel 121a, original image pixels 914 map to sensor pixels 440a, which have the smallest exposed areas 401 in sensor pixel clusters 400a.

Let A be the weight applied to the maximum aperture level array SA.1. Let B be the weight applied to the minimum aperture level array SA.2. A and B can both be in the range (0, 1) (inclusive) such that A+B=1. Therefore, a blended aperture array, SA.3 can be: SA.3=A*SA.1+ B*SA.2. The color channels and color values in SA.3 can be 1:1 copied to build the second mosaic 915.

Figure 12:
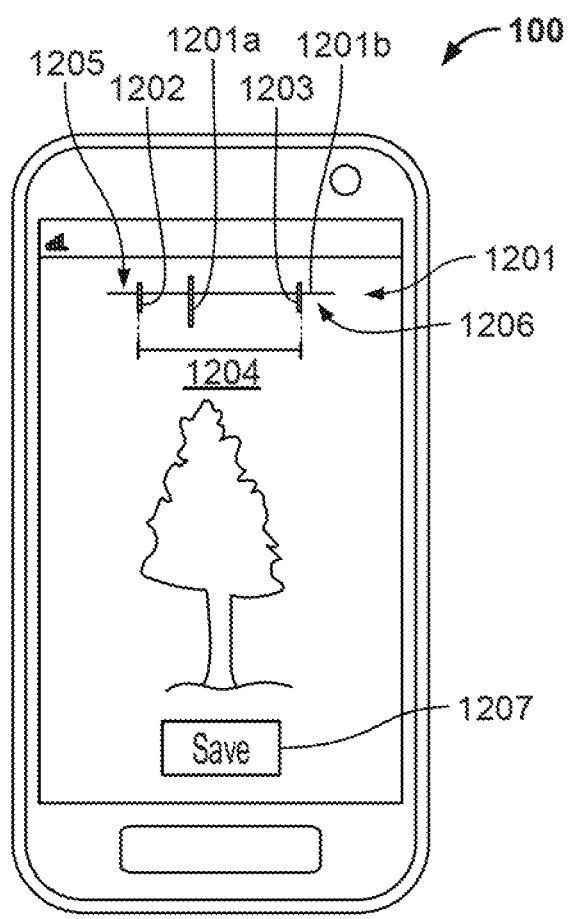
FIGS. 12 and 13 show an example mobile device in an example photo gallery mode.

SA.1, SA.2, A, and B can be automatically selected based on aperture simulation tool 151 (see FIG. 1) and/or aperture recomposition tool 1201 (see FIG. 12). For example, when a user selects a non-source aperture level (e.g., medium aperture level for sensor panel 121e), processing system 1800 can automatically set the next highest source aperture level as SA.1 and the next lowest source aperture level as SA.2. According to this example, SA.1 can be the collection of original image pixels 912 and SA.2 can be the collection of original image pixels 913.

Processing system 1800 can automatically select A and B based on the distance of the selected non-source aperture level between the selected source apertures levels. A and B can both be 0.5, but if the selected non-source aperture level is closer to SA.1, then SA.2, then A>B.

Referring to FIG. 10B, blending can be applied in-between any two cells in a common row, even if not illustrated. For example, a blend can be taken between maximum aperture level and high aperture level for sensor panel 121e. To reduce variance, blending can involve a weighted average of more than two different aperture levels. For example, the medium aperture level for sensor panel 121e can be: (911+912+913+914)/4 for each new image pixel 920. This can be re-written as 0.25*SA.1+0.25*SA.2+ 0.25*SA.3+0.25*SA.4, where SA.1 is maximum aperture level, SA.2 is large, SA.3 is small, and SA.4 is minimum.

Returning to FIG. 7B, and at block 706 (example operations for block 706 were previously discussed), processing system 1800 can bin the first mosaic 905 into a plurality of second mosaics 915. The first mosaic 905 can be Quad. Each second mosaic 915 can be Bayer.

Referring to FIG. 9, processing system 1800 can: (a) prepare a first-second mosaic 915, where each new image pixel 920 has the same color value as a first original image pixel 911, (b) prepare a second-second mosaic 915, where each new pixel 920 has the same color value as a second original image pixel 912, (c) prepare (i.e., produce) a third-second mosaic 915, where each new image pixel 920 has the same color value as a third original image pixel 913, and (d) prepare a fourth-second mosaic 915, where each new image pixel 920 has the same color value as a fourth original image pixel 914.

When sensor panel 121 includes sensor pixel clusters 400 having sensor pixels with the same sized exposure areas 401, processing system 1800 can take an average of (i.e., blend) the corresponding original image pixels 911-914 for one of the second mosaics 915, thus resulting in less than four second mosaics 915. For example, and for sensor panel 121c, processing system 1800 can prepare a Bayer second mosaic 915, where each new image pixel 920 in the Bayer second mosaic has color value equal to the average of third and fourth image pixels 913, 914.

Similarly, processing system 1800 can prepare a Bayer second mosaic 915 reflecting any of the above-discussed blending operations (e.g., a Bayer second mosaic where each new image pixel 920 is equal to the average of original image pixels 913 and 914 less original image pixel 911 less original image pixel 912).

FIG. 16 shows the source original image pixels 911-914 for a plurality of second mosaics 915. For example, sensor panel 121a can bin the first Quad mosaic 905 into three Bayer second mosaics 915.

A first Bayer second mosaic 915 can correspond to maximum aperture level where binning takes the average of original image pixels 911 and 912 (i.e., takes the average of the color values of original image pixels 911 and 912). A second Bayer second mosaic 915 can correspond to a medium aperture level where binning copies original image pixels 913. A third Bayer second mosaic 915 can correspond to a minimum aperture level where binning copies original image pixels 914. Similar concepts apply to the other sensor panels (e.g., sensor panel 121e can result in four Bayer second mosaics 915).

Returning to block 702, processing system 1800 can command sensor panel 121 to only integrate with selected sensor pixels based on the user selected aperture level (e.g., via tool 151). Selective integration can be accomplished in a variety of ways. For example, processing system 1800 can reset each sensor pixel, allow each sensor pixel to accumulative photocharge, but only read-out selected sensor pixels.

Sensor pixels can be selected with reference to FIG. 10B. Referring to FIG. 10B, only the sensor pixels that will contribute desired image pixels can be selected. Recall that first sensor pixel 410 maps to first original image pixel 911, second sensor pixel 420 maps to second original image pixel 912, and so on.

Selective integration can include only clearing and/or reading-out selected sensor pixels 410, 420, 430, and 440. This can enable sensor panel 121 to perform a faster rolling readout, a faster global readout, and/or reduce energy consumption. If blending is required, then more than one of sensor pixels 410, 420, 430, and 440 can be active and the results can be binned, as discussed above.

With continued reference to FIG. 10B, if a user selected a maximum simulated aperture for sensor panel 121a, then at block 702, processing system 1800 can only integrate with sensor pixels 410 and 420 (mapping to the blend of image pixels 911 and 912). If the user selected a high simulated aperture, then processing system 1800 can only integrate with sensor pixels 410, 420, and 430 (mapping to the blend between image pixels 911, 912, and 913). If the user selected a low simulated aperture level, then processing system 1800 can only integrate with sensor pixels 430 and 440 (mapping to the blend of image pixels 913 and 914).

When processing system 1800 integrates fewer than each sensor pixel 410, 420, 430, 440, processing system 1800 can prepare first mosaic 905. The first mosaic 905 can include blank entries for each of the non-integrated sensor pixels 410, 420, 430, 440. For example, and referring to FIGS. 4A-4E and 9, processing system 1800 can only integrate with first and second sensor pixels 410, 420. The first mosaic 905 can now include only color values and color channels for first and second original images pixels 911, 912. Color values for original image pixels 913 and 914 can be blank.

According to this example, processing system 1800 can bin first mosaic 905 into second mosaic 915 (e.g., a Bayer second mosaic 915) by blending the existing color values (e.g., taking a weighted average of original image pixels 911 and 912). Recall that the binning can occur at the digital or analog level. Therefore, the only digital mosaic produced can be Bayer second mosaic 915.

The above-discussed principles can apply to each of sensor panels 121a-121e. Thus, for each of sensor panels 121a-121e, processing system 1800 can apply at least three aperture levels: a maximum (representing the sensor pixel with the greatest exposed area 401), a minimum (representing the sensor pixel with the smallest exposed area 401), and an intermediate (representing a sensor pixel with an intermediate exposed area 401 or representing a weighted average between sensor pixels with different sized exposed areas 401).

At block 708, processing system 1800 can demosaic each of the one or more second image mosaics 915 into a full-color image. Demosaicing can include one or more remosaicing steps followed by full-color interpolation. Block 708 (or any of the other blocks disclosed herein) can include additional operations, such as photometric adjustment operations (color balancing, etc). At block 710, processing system 1800 can save each of the one or more full-color images as a stable image (e.g., in volatile memory or in non-volatile memory).

Demosaicing can be performed for each of the aperture levels. For example, if sensor panel 121 includes four different aperture levels (e.g., sensor panel configuration 121e) the first mosaic can be binned into four different second mosaics. Each second mosaic can have one aperture level. For example: each image pixel in a first-second mosaic can map to sensor pixels 410e; each image pixel in a first-second mosaic can map to sensor pixels 420e; each image pixel in a first-second mosaic can map to sensor pixels 430e; each image pixel in a first-second mosaic can map to sensor pixels 440e. Each of the second mosaics can then be demosaiced separately. Processing system 1800 can save and present each of the resulting full-color images. A user can thus view each of the resulting full-color images.

Alternatively or in addition, demosaicing can be performed on the complete first mosaic, which can include data for each of the aperture levels. The demosaicing algorithm can rely on the data for each aperture level and can produce a full-color image with a total number of image pixels equal to the total number of sensor pixels. The demosaicing algorithm can be configured to result in a certain aperture level and thus interpolation in the demosaicing algorithm can account for the different aperture levels in image pixel clusters. Demosaicing (and thus interpolation) can be performed by a neural network (e.g., a convolutional neural network).

When the user enters the general viewfinder mode, processing system 1800 can cycle through blocks 700-710 to present a continuous stream of images on display 102. During general viewfinder mode, and at block 710, the one or more full-color images can be not saved as a stable image or saved as a stable image, but immediately discarded after presentation on display 102. Furthermore, processing system 1800 can decline to save the first mosaic 905 as a stable file during viewfinder mode.

When the user presses the capture button in viewfinder mode (thus entering a capture viewfinder mode or a capture mode), processing system 1800 can perform blocks 700-710 and save each of the one or more full-color images as a stable image. Furthermore, processing system 1800 can save the first mosaic 905 as the stable file to enable recomposition.

According to some examples, processing system 1800 performs blocks 700-710 according to a first technique when in general viewfinder mode and performs blocks 700-710 according to a second technique when in capture viewfinder mode (i.e., after the user presses take picture virtual button 104). The first technique can be any example of performing blocks 700-710 disclosed herein. The second technique can be any example (including a different example) of performing blocks 700-710 disclosed herein.

At block 712, processing system 1800 can receive a user selection of a stable image. At block 714, processing system 1800 can present the full-color image (e.g., display a sample thereof) in a photo-editing mode. According to some examples, processing system 1800 defaults to presenting the full-color image corresponding to the aperture level selected with tool 151 during viewfinder mode.

At block 716, and when in photo-editing mode, processing system 1800 can present aperture recomposition tool 1201 (see FIG. 12). Aperture recomposition tool 1201 can also be called an "aperture priority mode selector". The tool 1201 can be a plurality of buttons (not shown). The tool 1201 can be a virtual slider as shown in FIG. 12. The user can recompose aperture by moving toggle 1201a along line 1201b. Aperture recomposition tool 1201 can be similar to aperture simulation tool 151, except aperture recomposition tool 1201 can appear during photo editing mode whereas aperture simulation tool 151 can appear during viewfinder mode.

At block 718, processing system 1800 can receive a recomposed aperture level via the tool 1201 (e.g., by moving toggle 1201a along line 1201b). The tool 1201 can only enable user-selection of minimum aperture level 1202, a maximum aperture level 1203, and any intermediate aperture levels (within region 1204). The tool 1201 can enable user-selection of aperture level (a) over the maximum aperture level (region 1205) through post-processing (e.g., low-pass filtering) and (b) under the minimum aperture level (region 1206) through post-processing (e.g., high-pass filtering).

Based on the recomposed aperture level, processing system 1800 can re-access the Quad first image mosaic 905 at block 704, then perform blocks 706-710 to present (e.g., display a sample of) an image with a recomposed aperture at block 720. If the user is satisfied with the recomposed image and clicks a save button 1207, processing system 1800 can retain the image in memory (e.g., save in non-volatile memory as a stable image file). If the user is unsatisfied with the recomposed image, the user can further recompose aperture level via tool 1201.

According to some examples, processing system 1800 is configured to display (e.g., via the tool 1201), a current aperture level of a presented full-color image by accessing metadata in the presented image. According to some examples, when the tool appears, the tool 1201 (e.g., toggle 1201a) is initially set to the current aperture level to give the user context for recomposing aperture level.

Figure 13:
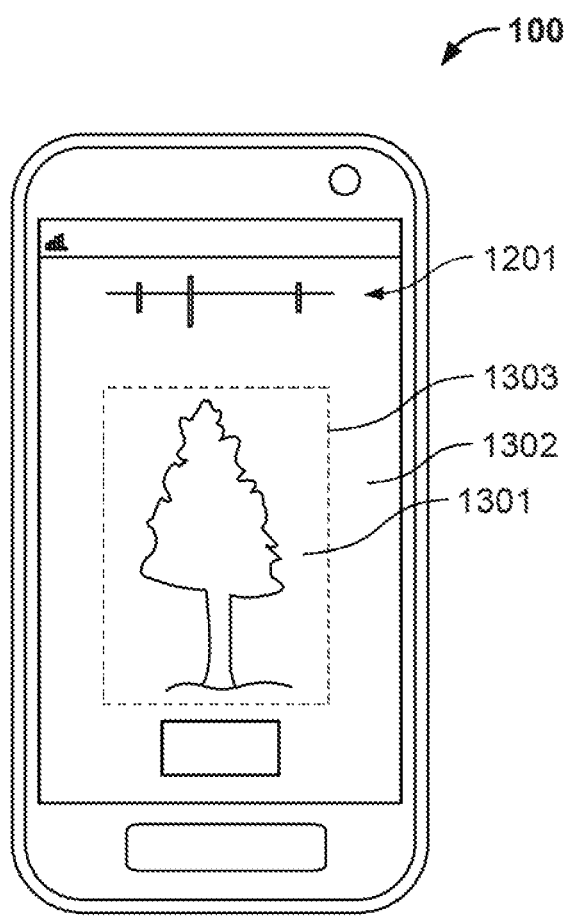

During block 718, processing system 1800 can enable recomposition of a particular region of a full-color image. Referring to FIG. 13, the user can draw a closed shape 1303 to select a first region 1301 of image pixels in a full-color image. The first region 1301 can be automatically selected by processing system 1800 in response to a user-command (e.g., identify all regions deeper than the field). The second region 1302 can be image pixels exterior to the selected first region 1301. First region 1301 can be the entire image.

The user can apply the tool 1201 to recompose aperture level for only image pixels within first region 1301 or only image pixels within second region 1302. The following examples assume that pixels within first region 1301 will have a recomposed aperture level and that pixels within second region 1302 will not have a recomposed aperture level. According to the techniques discussed below, a plurality of different first regions 1301 can be selected, and each assigned a different recomposed aperture level.

Figure 14:
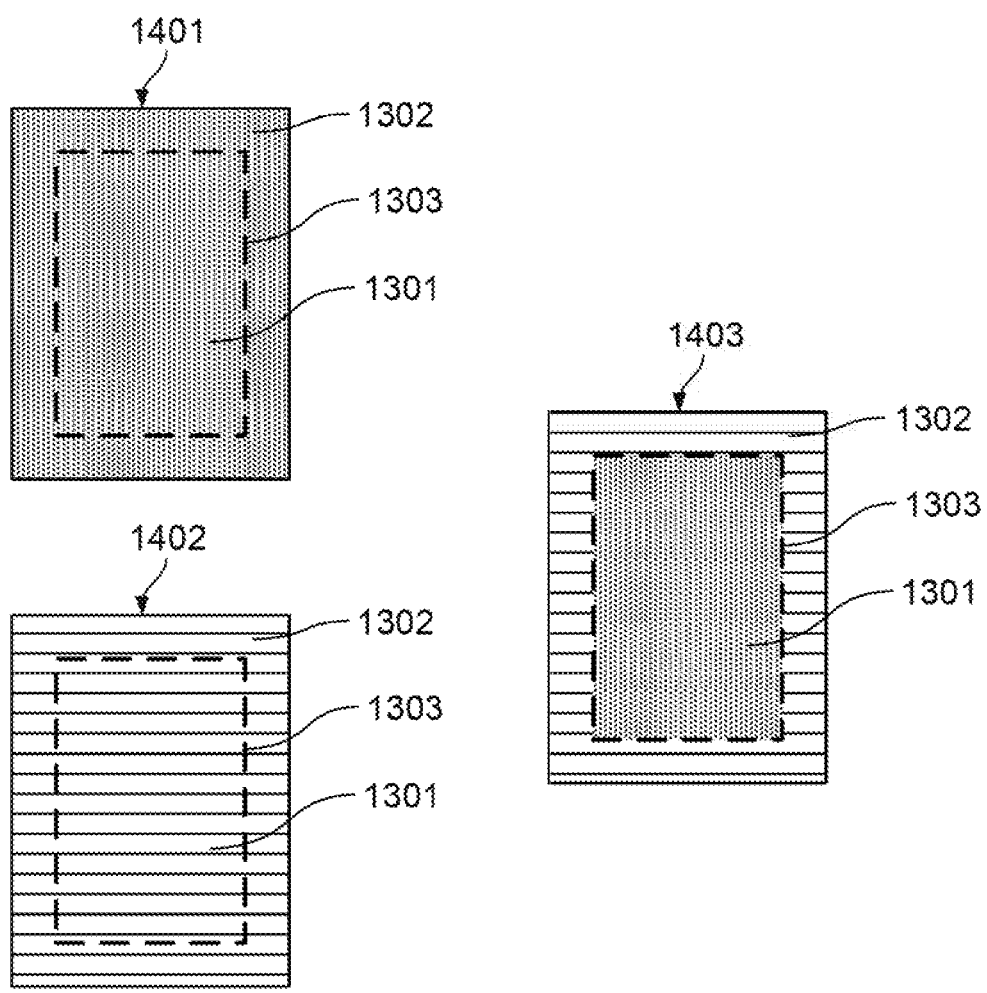
FIG. 14 graphically illustrates an example compositing process for a full-color image level aperture recomposition.
Figure 15:
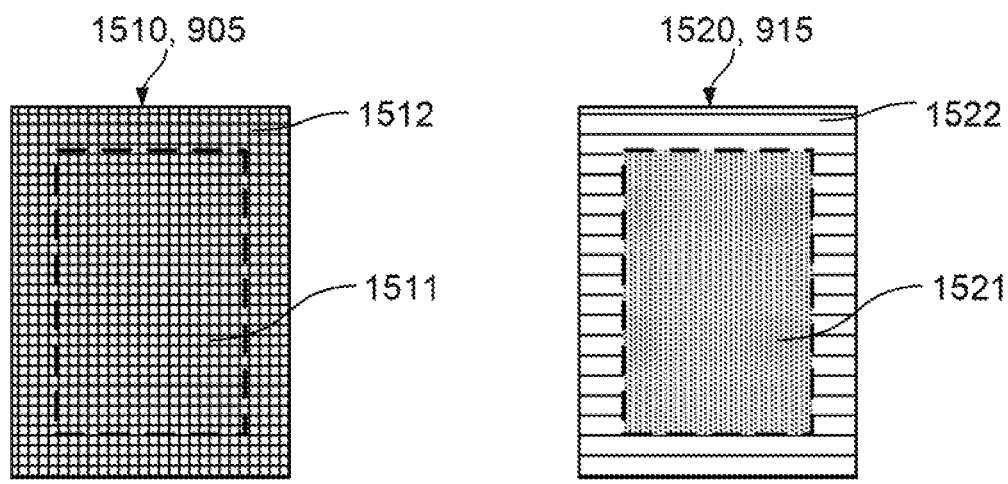
FIG. 15 graphically illustrates an example compositing process for a mosaic level aperture recomposition.

Processing system 1800 can be configured to recompose aperture level at (a) full-color image level and/or (b) at a mosaic level. FIG. 14 relates to full-color image level recomposition. FIG. 15 relates to mosaic level recomposition.

Full-Color Image Level:

FIG. 14 shows original aperture level full-color image 1401, new aperture level full-color image 1402, and composite image 1403. New aperture level full-color image 1402 can be automatically generated according to blocks 704-710 after processing system 1800 receives a recomposed aperture level at block 718. Alternatively, new aperture level full-color image 1402 can be loaded from non-volatile memory since a plurality of full-color images can be generated at block 708.

For reasons that will become apparent below, multiple different aperture level full-color images can be generated/accessed. The different hatching patterns in images 1401 and 1402 indicate different aperture levels. Images 1401 and 1402 can otherwise depict the same scene (e.g., camera 101 can capture images 1401 and 1402 in parallel).

During block 720, processing system 1800 can composite first region 1301 of new aperture level full-color image 1402 with second region 1302 of original aperture level full-color image 1401. The composite can result in composite image 1403. Composite image 1403 can include post-processing (e.g., color balancing) to hide transitions (e.g., at perimeter 1303) between first region 1301 and second region 1302.

Multiple full-color images can be blended at block 720 to simulate intermediate apertures level. FIG. 17 refers to FIG. 16 and uses the conventions "max" for "maximum", "min" for "minimum" and "AL" for "aperture level."

Figure 18:
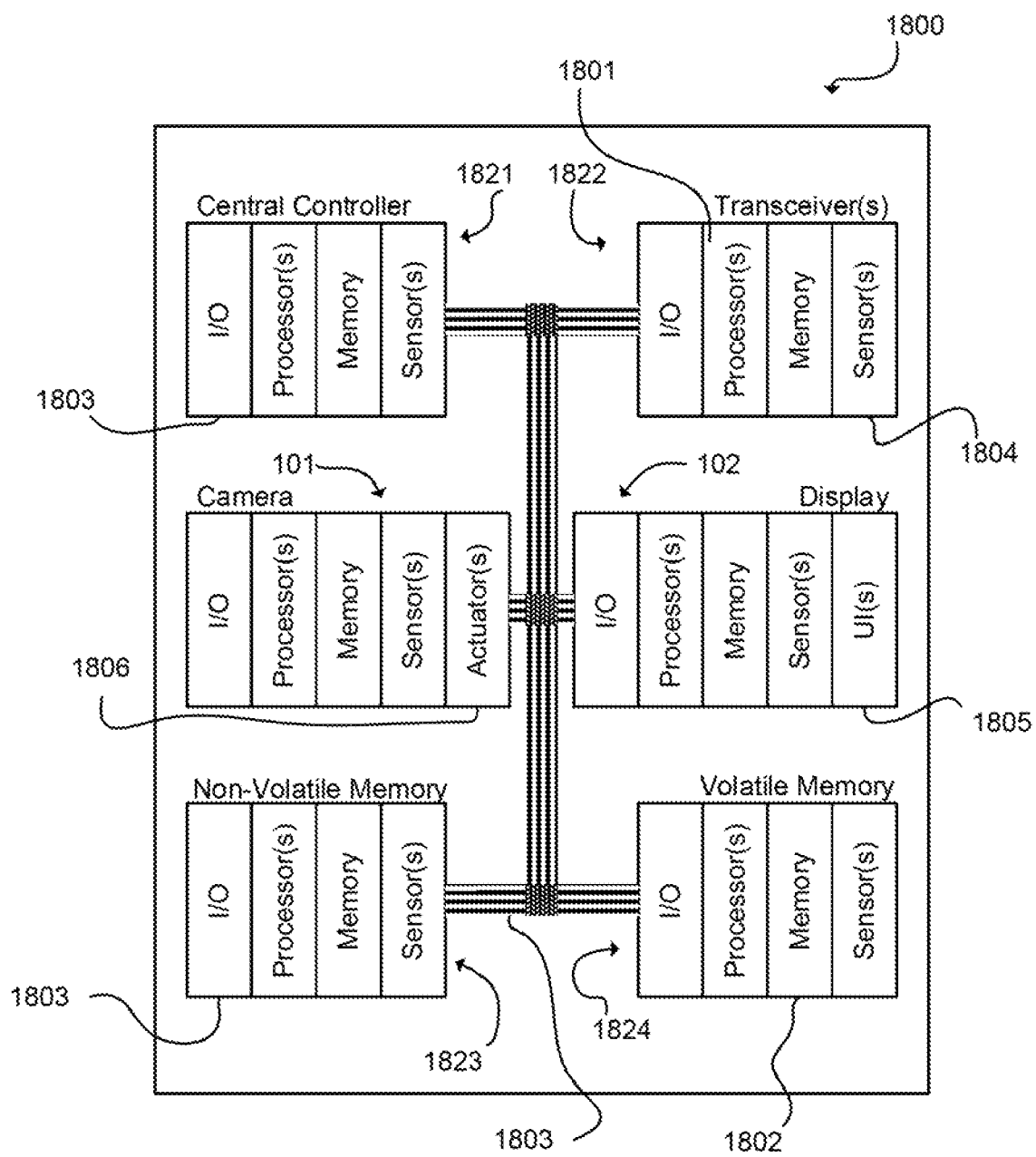
FIG. 18 is a block diagram of a processing system.

When blending according to FIG. 18, each color channel can be independently blended. Assume that image pixel A is in the maximum aperture level full-color image and that image pixel B is in the medium aperture level full-color image. Assume image pixel A has color channels G-I, B-J, R-K, where I, J, and K are real numbers. Assume image pixel B has color channels G-X, B-Y, R-Z, where X, Y, and Z are real numbers. Assume that image pixel A spatially maps to image pixel B.

The blended full-color image pixel C, spatially mapping to image pixel A and image pixel B, can be a weighted average of I and X, J and Y, and K and Z. More specifically, the blended full-color image pixel C can have color channels G–(a*I+b*X), B–(a*J+b*Y), R–(a*K+b*Z), where a+b=1, a>0, b>0, and a and b are selected based on the recomposed aperture level. For example, for sensor panel 121d, if a high recomposed aperture level was selected, then a>b, and if a low recomposed aperture level was selected, then b>a. Other blending techniques can be applied.

Referring to FIG. 14, each pixel within first region 1301 of recomposed image 1403 can be derived (e.g., extracted) from one full-color image (or a blend of multiple full-color images) and each pixel within second region 1302 of recomposed image 1403 can be derived (e.g., extracted) from another full-color image (or a blend of multiple full-color images). In FIG. 14, second region 1302 of recomposed image 1403 was extracted from second region 1302 of new aperture level image 1402 and first region 1301 of recomposed image 1403 was extracted from first region 1301 of original aperture level image 1401. The hatching patterns in FIG. 14 illustrate the same.

Mosaic Level:

Processing system 1800 can recompose aperture level at the mosaic level. For example, processing system 1800 can load the first mosaic at block 704, bin according to a first technique for first region 1301 and bin according to a second technique for second region 1302.

For example, and referring to FIG. 9, assume first region 1301 maps to new image pixel 920a, and thus original image pixels 911a, 912a, 913a, and 914a. Further assume second region 1302 maps to new image pixel 920b, and thus original image pixels 911b, 912b, 913b, and 914b. According to this example, processing system 1100 can bin pixel cluster 910a according to the original aperture level and bin pixel cluster 910b according to the recomposed (e.g., new) aperture level.

FIG. 15 illustrates these principles on a wider scale. FIG. 15 shows a first image mosaic 1510, 905 and a second image mosaic 1520, 915. First mosaic 1510 can be loaded from memory. First mosaic 1510 can be segmented into a first area 1511 and a second area 1512. First area 1511 can map to first region 1301. Second area 1512 can map to second region 1302. In FIG. 15, first mosaic 1510 can have an undecided aperture level (indicated with square hatching) since first mosaic 1510 can include sufficient information to produce a plurality of different aperture levels, depending on the binning algorithm applied.

First area 1511 can be binned according to a first binning technique. Second area 1512 can be binned according to a second binning technique. The first binning technique can be derived from FIG. 10B based on the original aperture level (or any other desired aperture level). The second binning technique can be derived from FIG. 10B based on the recomposed aperture level.

The second mosaic 1520, 915 (also called a composite mosaic) can therefore include a first area 1521 and a second area 1522. First area 1521 can map to first region 1301. Second area 1522 can map to second region 1302. Referring to FIGS. 14 and 15, and as indicated with common hatching, first area 1521 of second mosaic 1520 can have the same aperture level as original full-color image 1401 and region 1301 of composite image 1403. As indicated with common hatching, second area 1522 of second mosaic 1520 can have the same aperture level as new aperture level image 1402 and region 1302.

Second mosaic 1520 can have a Bayer pattern. Processing system 1800 can perform blocks 708 and 710 with respect to the second mosaic 1520, then present the full-color image derived from the second mosaic 1520 at block 720. The full-color image derived from second mosaic 1520 can be similar, but not identical to, composite full-color image 1403.

The disclosed technology can be applied in a variety of different ways. For example, and as previously discussed, processing system 1800 can continuously modify aperture level (e.g., according to a user-input or according to automatic control) when in viewfinder mode. While in viewfinder mode, processing system 1800 can present a stream of images. The stream of images can represent frames of a video. As previously discussed, a selected aperture level can cause favoring/disfavoring (i.e., higher/lower weighting) of certain sensor/image pixels.

Processing system 1800 can perform automatic control based on scene depth (e.g., depth of certain objects within a scene). For example, processing system 1800 can automatically select an image aperture level based on a depth of a desired object (e.g., a face). processing system 1800 can present an image with a plurality of aperture levels. For example, if object A is at a first depth and object B is at a second depth, then processing system 1800 can apply a first aperture level to the image pixels mapping to object A and a second aperture level to the image pixels mapping to B.

Processing system 1800 can perform automatic control based on hyperfocal distance of a lens of camera 101. If an object has a depth less than the hyperfocal distance, then a lower aperture level can be applied, but if an object has a depth greater than the hyperfocal distance, then a higher aperture level can be applied.

If camera 101 is front facing (e.g., camera 101a) (also called a selfie-camera), then processing system 1800 can be configured to detect a depth of a face (e.g., via a depth sensor such as a stereoscopic camera pair or an infrared rangefinder), then select an aperture level based on the depth. If the face is within a predetermined depth range (e.g., 50-100 cm), then processing system 1800 can apply a higher aperture level. If the face is outside the depth range (e.g., 0-50 cm and/or 100-infinity cm), then processing system 1800 can apply a lower aperture level.

Processing system 1800 can perform automatic control based on an automatic scene mode detection algorithm. For example, processing system 1800 can adjust aperture level based on whether camera 101 is in portrait mode (corresponding to images with a portrait aspect ratio where height is greater than width) or is in landscape mode (corresponding to images with a landscape aspect ratio where width is greater than height).

Referring to FIG. 1, mobile device 100 can be a smartphone 100a, a tablet or a laptop. Mobile device 100 can be a dedicated camera assembly 100b. Mobile device 100 can be mounted to a larger structure (e.g., a vehicle or a house). Mobile device 100 (or any other device, such as a vehicle or desktop computer) can include processing system 1800. Processing system 1800 can be distributed across a network (e.g., the Internet).

Referring to FIG. 18, processing system 1800 can include one or more processors 1801, memory 1802, one or more input/output devices 1803, one or more sensors 1804, one or more user interfaces 1805, and one or more actuators 1806.

Processors 1801 can include one or more distinct processors, each having one or more cores. Each of the distinct processors can have the same or different structure. Processors 1801 can include one or more central processing units (CPUs), one or more graphics processing units (GPUs), circuitry (e.g., application specific integrated circuits (ASICs)), digital signal processors (DSPs), and the like. Processors 1801 can be mounted on a common substrate or to different substrates. Processors 1801 can include circuitry of sensor panel 121.

Processors 1801 are configured to perform a certain function, method, or operation at least when one of the one or more of the distinct processors is capable of executing code, stored on memory 1802 embodying the function, method, or operation. Processors 1801 can be configured to perform any and all functions, methods, and operations disclosed herein.

For example, when the present disclosure states that processing system 1800 can perform task "X", such a statement should be understood to disclose that processing system 1800 can be configured to perform task "X". Mobile device 100 and processing system 1800 are configured to perform a function, method, or operation at least when processors 1801 are configured to do the same.

Memory 1802 can include volatile memory, non-volatile memory, and any other medium capable of storing data. Each of the volatile memory, non-volatile memory, and any other type of memory can include multiple different memory devices, located at multiple distinct locations and each having a different structure. Examples of memory 1802 include a non-transitory computer-readable media such as RAM, ROM, flash memory, EEPROM, any kind of optical storage disk such as a DVD, a Blu-Ray® disc, magnetic storage, holographic storage, an HDD, an SSD, any medium that can be used to store program code in the form of instructions or data structures, and the like. Any and all of the methods, functions, and operations described in the present application can be fully embodied in the form of tangible and/or non-transitory machine-readable code saved in memory 1802.

Input-output devices 1803 can include any component for trafficking data such as ports, antennas (i.e., transceivers), printed conductive paths, and the like. Input-output devices 1803 can enable wired communication via USB®, DisplayPort®, HDMI®, Ethernet, and the like. Input-output devices 1803 can enable electronic, optical, magnetic, and holographic, communication with suitable memory 1802. Input-output devices can enable wireless communication via WiFi®, Bluetooth®, cellular (e.g., LTE®, CDMA®, GSM®, WiMax®, NFC®), GPS, and the like. Input-output devices 403 can include wired and/or wireless communication pathways.

Sensors 1804 can capture physical measurements of environment and report the same to processors 1801. Examples of sensors 1804 include photodiodes and thermocouples. User interface 1805 can include displays (e.g., LED touchscreens (e.g., OLED touchscreens), physical buttons, speakers, microphones, keyboards, and the like. User interface 1805 can include display 102 and hard button 103 (see FIG. 1). Actuators 1806 can enable processors 1801 to control mechanical forces. If camera 101 includes auto-focus, then motors/actuators 1806 can move a lens along its optical axis to provide auto-focus and/or perform optical image stabilization.

Processing system 1800 can be modular. As shown, processing system 400 can include one or more central controllers 1821, one or more transceiver modules 1822, one or more camera modules (also called cameras) 101, one or more display modules 102, non-volatile memory module(s) 423, and volatile memory module(s) 424. Each module can include one or more processors 1801, one or more units of volatile memory 1802, one or more units of non-volatile memory 1802, one or more input-output devices 1803, one or more sensors 1804, one or more user interfaces 1805, and one or more actuators 1806. Input/output devices 1803 can connect the modules as schematically shown via wired and/or wireless communication pathways. Any module can represent a plurality of discrete modules. For example, non-volatile memory module 1823 can include a solid-state memory 1802 within mobile device 100 and cloud-storage memory 1802 external to mobile device 100. Transceiver(s) 1822 can include one or more modems enabling two-way wireless communication via one or more antennas.

Processing system 1800 can include a plurality of other modules. Processing system 1800 can include multiple instances of any module shown in FIG. 18. Processing system 1800 can omit any module shown in FIG. 18. Processing system 1800 can be confined within a single device (e.g., mobile device 100). Processing system 1800 can be distributed (e.g., at least one non-volatile memory module 1823 can be disposed in a remote server and the other modules can be disposed in mobile device 100).

I claim:

1. An image processing method comprising, via one or more processors:
   receiving an aperture level;
   producing a full-color image by applying a greater weight to first image pixels received from first sensor pixels and assigning a lesser weight to second image pixels received from second sensor pixels based on the received aperture level, the greater weight exceeding the lesser weight.

2. The method of claim 1, wherein each first sensor pixel comprises a first shield defining a first aperture and each second sensor pixel comprises a second shield defining a second aperture, the first and second shields configured to block visible light, the first shields being larger or smaller than the second shields.

3. The method of claim 2, wherein each first shield is a first peripheral shield and each first aperture is a first central aperture, each first peripheral shield two-dimensionally enclosing one of the first central apertures.

4. The method of claim 1, wherein producing the full-color image comprises:
producing a first mosaic of the image comprising the first original image pixels received from the first sensor pixels and the second image pixels received from the second sensor pixels; and
applying the greater weight to the first image pixels and applying the lesser weight to the second sensor pixels by remosaicing the first mosaic into a second mosaic based on the received aperture level.

5. The method of claim 4, wherein the remosaicing comprises binning each first image pixel with one second image pixel to produce a first new image pixel, the binning comprising applying no weight to color values of the second image pixels and applying a positive weight to color values of the first image pixels.

6. The method of claim 5, wherein the first mosaic has a Quad pattern and the second mosaic has a Bayer pattern.

7. The method of claim 1, wherein producing the full-color image comprises:
integrating each of the first sensor pixels for a first amount of time;
integrating each of the second sensor pixels for a second amount of time;
the first amount of time being longer or shorter than the second amount of time.

8. The method of claim 7, wherein the full-color image is a first full-color image and the method comprises producing a second full-color image by:
integrating each of the first sensor pixels and the second sensor pixels for an equal amount of time.

9. The method of claim 1, wherein the received aperture level governs a depth of field of the full-color image such that when the received aperture level is high, the depth of field is shallow and when the received aperture level is low, the depth of field is deep.

10. The method of claim 1, wherein each of the first sensor pixels having a first color-filter-independent-photosensitivity (CFIP) and each of the second sensor pixels having a second CFIP, the first CFIP being larger or smaller than the second CFIP.

11. An image processing method comprising, via one or more processors:
receiving a first aperture level;
producing a first mosaic of an image;
remosaicing the first mosaic into a second mosaic of the image based on the received first aperture level;
demosaicing the second mosaic of the image into a first full-color image;
receiving a second aperture level;
remosaicing the first mosaic into a third mosaic of the image based on the received second aperture level; and
demosaicing the third mosaic of the image into a second full-color image.

12. The method of claim 11, wherein the first received aperture level is a higher aperture level and the first full-color image has a shallower depth of field;
the second received aperture level being a lower aperture level and the second full-color image having a deeper depth of field.

13. The method of claim 11, comprising presenting the first full-color image on a display before receiving the second aperture level.

14. A processing system comprising:
an image sensor panel comprising first sensor pixels and second sensor pixels;
one or more processors configured to:
receive an aperture level;
produce a full-color image by applying a greater weight to first image pixels received from first sensor pixels and assigning a lesser weight to second image pixels received from second sensor pixels based on the received aperture level, the greater weight exceeding the lesser weight.

15. The system of claim 14, wherein each first sensor pixel comprises a first shield defining a first aperture and each second sensor pixel comprises a second shield defining a second aperture, the first and second shields configured to block visible light, the first shields being larger or smaller than the second shields.

16. The system of claim 15, wherein each first shield is a first peripheral shield and each first aperture is a first central aperture, each first peripheral shield two-dimensionally enclosing one of the first central apertures.

17. The system of claim 14, wherein the one or more processors are configured to produce the full-color image by:
producing a first mosaic of the image comprising the first image pixels received from the first sensor pixels and the second image pixels received from the second sensor pixels; and
applying the greater weight to the first image pixels and assigning the lesser weight to the second image pixels by remosaicing the first mosaic into a second mosaic based on the received aperture level.

18. The system of claim 17, wherein the one or more processors are configured to perform the remosaicing by binning each first original image pixel with one second image pixel to produce a first new image pixel, the binning comprising assigning no weight to color values of the second image pixels and assigning a positive weight to color values of the first image pixels.

19. The system of claim 18, wherein the first mosaic has a Quad pattern and the second mosaic has a Bayer pattern.

20. The system of claim 14, wherein the one or more processors are configured to produce the full-color image by:
integrating each of the first sensor pixels for a first amount of time;
integrating each of the second sensor pixels for a second amount of time;
the first amount of time being longer or shorter than the second amount of time.

21. The system of claim 20, wherein the full-color image is a first full-color image and the one or more processors are configured to prepare a second full-color image by integrating each of the first sensor pixels and the second sensor pixels for an equal amount of time.

22. The system of claim 14, wherein the one or more processors are configured to cause the received aperture level to govern a depth of field of the full-color image such that when the received aperture level is higher, the depth of field is shallower and when the received aperture level is lower, the depth of field is deeper.

23. The system of claim 14, wherein each of the first sensor pixels having a first color-filter-independent-photosensitivity (CFIP) and each of the second sensor pixels having a second CFIP, the first CFIP being larger or smaller than the second CFIP.

24. A processing system comprising:
  means for receiving an aperture level;
  means for producing a full-color image by assigning a greater weight to first image pixels received from first sensor pixels and assigning a lesser weight to second image pixels received from second sensor pixels based on the received aperture level, the greater weight exceeding the lesser weight.

25. The processing system of claim 24, wherein a color-filter-independent-photosensitivity (CFIP) of the first sensor pixels is different than a CFIP of the second sensor pixels.

\* \* \* \* \*